(12) United States Patent
Xie et al.

(10) Patent No.: US 12,490,507 B2
(45) Date of Patent: Dec. 2, 2025

(54) DIFFERENT DIMENSIONS ACROSS ACTIVE REGION FOR STRONGER VIA TO BACKSIDE POWER RAIL

(71) Applicant: INTERNATIONAL BUSINESS MACHINES CORPORATION, Armonk, NY (US)

(72) Inventors: Ruilong Xie, Niskayuna, NY (US); Albert M. Chu, Nashua, NH (US); Carl Radens, LaGrangeville, NY (US); Brent A. Anderson, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 665 days.

(21) Appl. No.: 17/931,319

(22) Filed: Sep. 12, 2022

(65) Prior Publication Data

US 2024/0088146 A1 Mar. 14, 2024

(51) Int. Cl.
*H10D 84/85* (2025.01)
*H01L 23/528* (2006.01)
(Continued)

(52) U.S. Cl.
CPC ......... *H10D 84/85* (2025.01); *H01L 23/5286* (2013.01); *H10D 30/014* (2025.01);
(Continued)

(58) Field of Classification Search
CPC ............... H10D 84/85; H10D 84/8311; H10D 84/8312; H10D 84/83135; H10D 84/83138; H10D 84/8314; H10D 84/8316; H10D 84/851; H10D 84/852; H10D 30/01; H10D 30/014; H10D 30/019; H10D 30/0198;
(Continued)

(56) References Cited

U.S. PATENT DOCUMENTS

| 9,570,395 | B1 | 2/2017 | Sengupta |
| 9,634,092 | B2 | 4/2017 | Bhuwalka |
| 9,898,573 | B2 | 2/2018 | Culp |
| 10,586,765 | B2 | 3/2020 | Smith |

(Continued)

OTHER PUBLICATIONS

Mathur et al., "Buried Bitline for sub-5nm SRAM Design", 2020 IEEE International Electron Devices Meeting (IEDM), Dec. 2020, 04 pages.
(Continued)

*Primary Examiner* — Fernando L Toledo
*Assistant Examiner* — Ryan T. Fortin
(74) *Attorney, Agent, or Firm* — Robert R. Aragona

(57) ABSTRACT

According to the embodiment of the present invention, a semiconductor device includes a first nanodevice and a second nanodevice. The second nanodevice is located adjacent to and parallel to the first nanodevice along a first axis. The first nanodevice and the second nanodevice each include a first section, a second section, and a third section. A first gate cut region is located between the first sections of the first nanodevice and the second nanodevice. A middle gate cut region is located between the second sections of the first nanodevice and the second nanodevice. A third gate cut region is located between the third sections of the first nanodevice and the second nanodevice. The middle gate cut region has different dimensions along a second axis than the first gate cut region and the third gate cut region.

20 Claims, 33 Drawing Sheets

(51) Int. Cl.
*H10D 30/01* (2025.01)
*H10D 30/43* (2025.01)
*H10D 30/67* (2025.01)
*H10D 62/10* (2025.01)
*H10D 84/01* (2025.01)
*H10D 84/03* (2025.01)

(52) U.S. Cl.
CPC ......... *H10D 30/43* (2025.01); *H10D 30/6729* (2025.01); *H10D 30/6735* (2025.01); *H10D 62/121* (2025.01); *H10D 84/0167* (2025.01); *H10D 84/0186* (2025.01); *H10D 84/038* (2025.01)

(58) Field of Classification Search
CPC .... H10D 30/43; H10D 30/435; H10D 30/501; H10D 30/509; H10D 30/6729; H10D 30/6735; H10D 62/121
See application file for complete search history.

(56) References Cited

U.S. PATENT DOCUMENTS

| | | | |
|---|---|---|---|
| 10,636,739 | B2 | 4/2020 | Beyne |
| 10,700,207 | B2 | 6/2020 | Chen |
| 10,950,546 | B1 | 3/2021 | Doornbos |
| 11,011,547 | B2 | 5/2021 | Costaganna |
| 2018/0145030 | A1 | 5/2018 | Beyne |
| 2020/0105671 | A1 | 4/2020 | Lai |
| 2021/0202472 | A1 | 7/2021 | Thomson |
| 2021/0305381 | A1 | 9/2021 | Chiang |
| 2023/0137766 | A1* | 5/2023 | Huang ................ H10D 84/038 257/152 |

OTHER PUBLICATIONS

Prasad et el., "Buried Power Rails and Back-side Power Grids: Arm® CPU Power Delivery Network Design Beyond 5nm", 2019 IEEE International Electron Devices Meeting (IEDM), Dec. 2019, 04 pages.

* cited by examiner

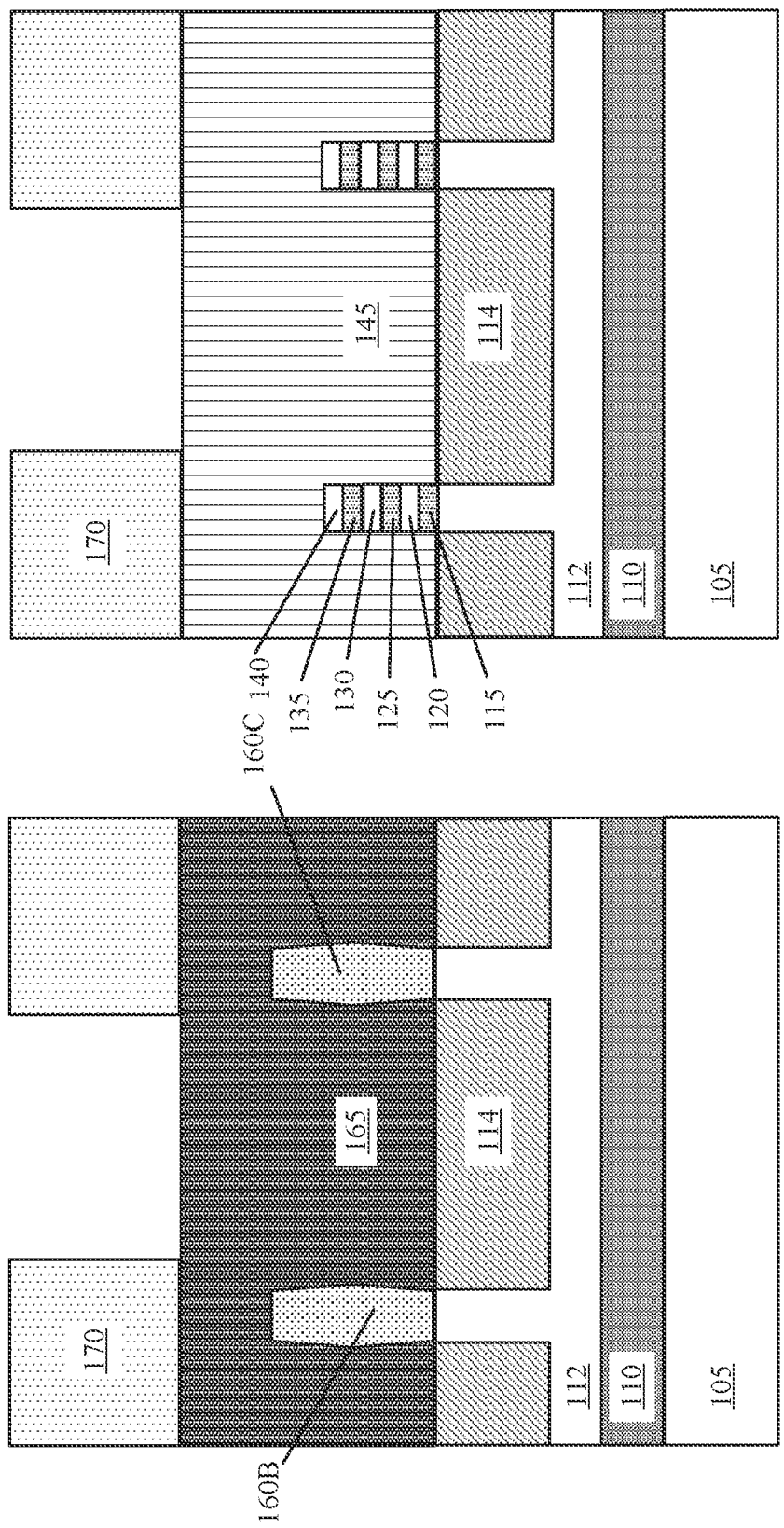

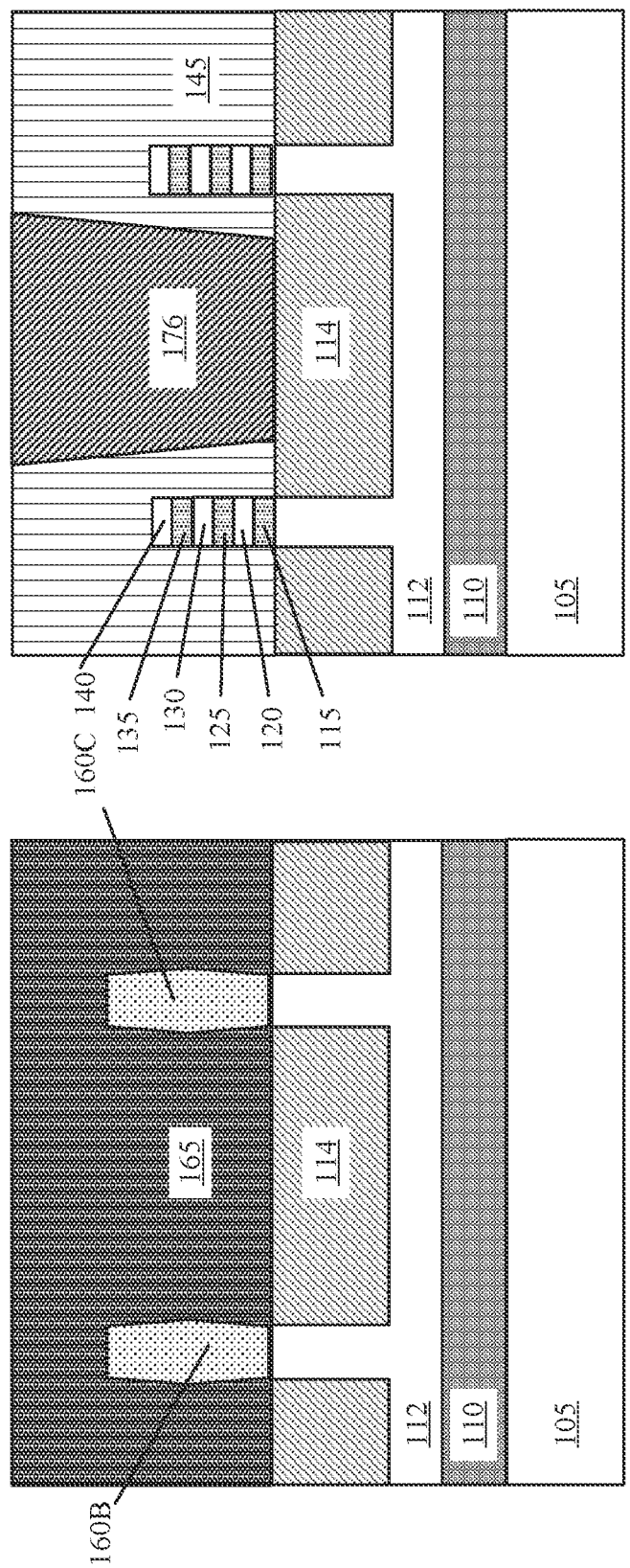

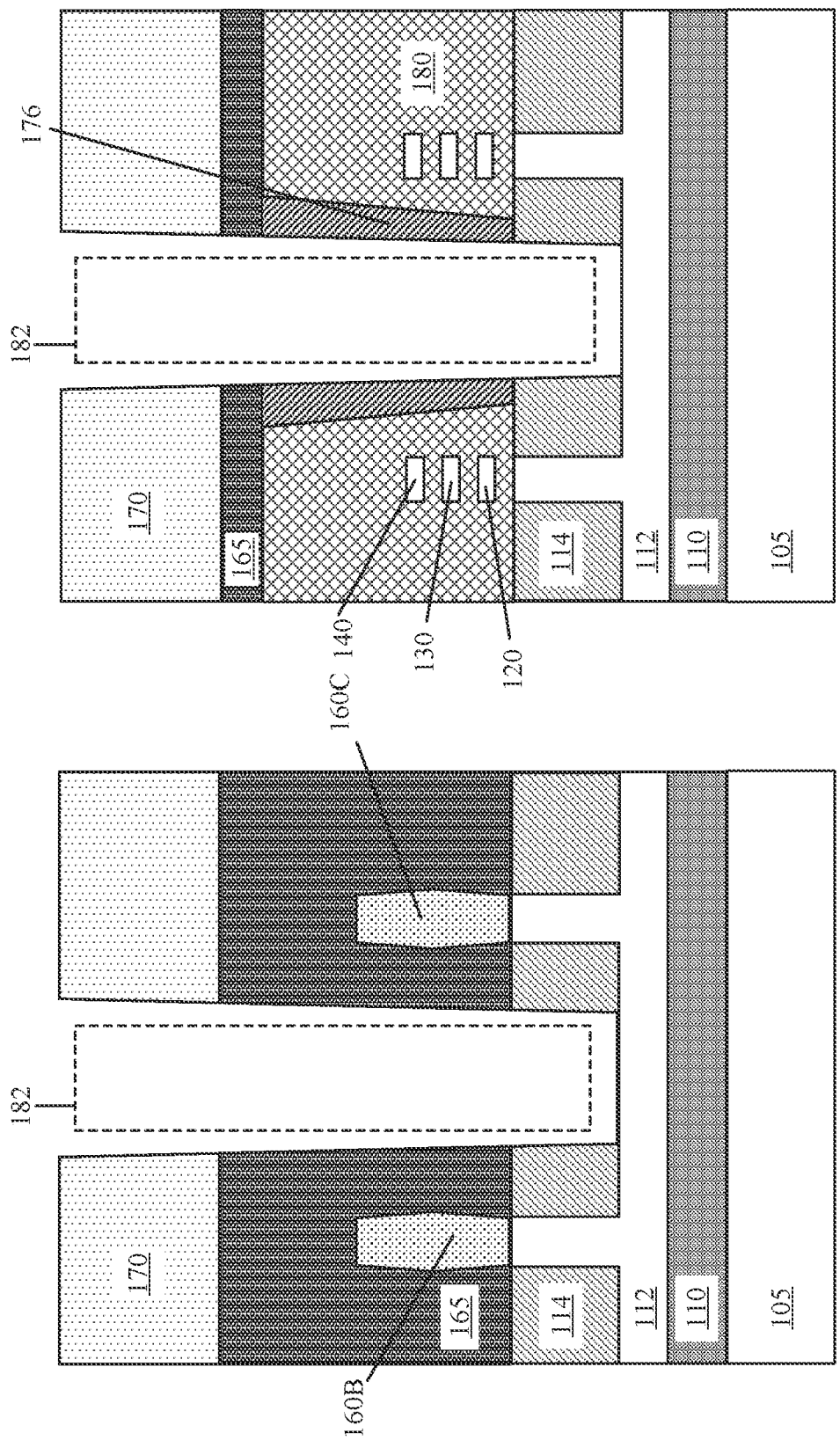

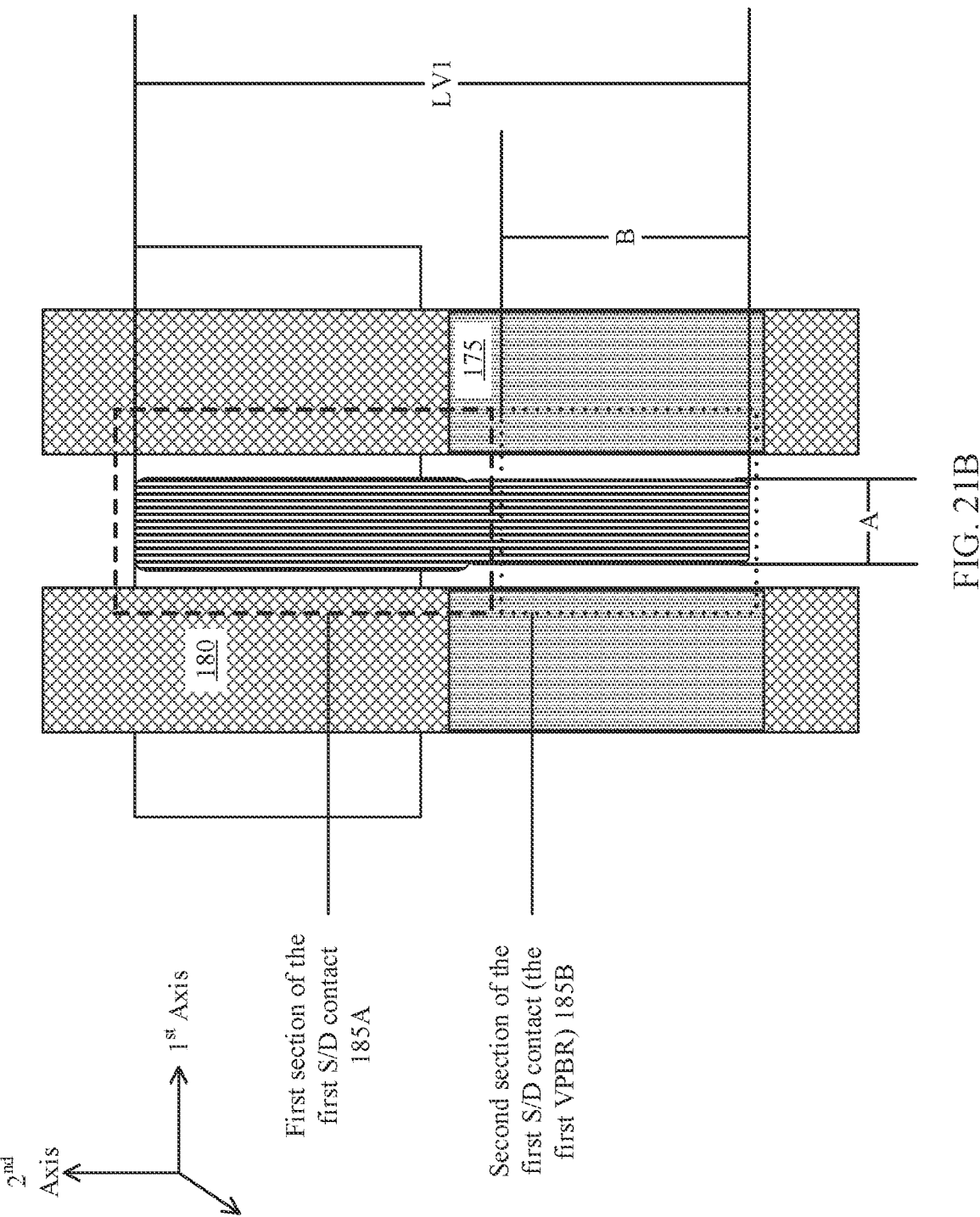

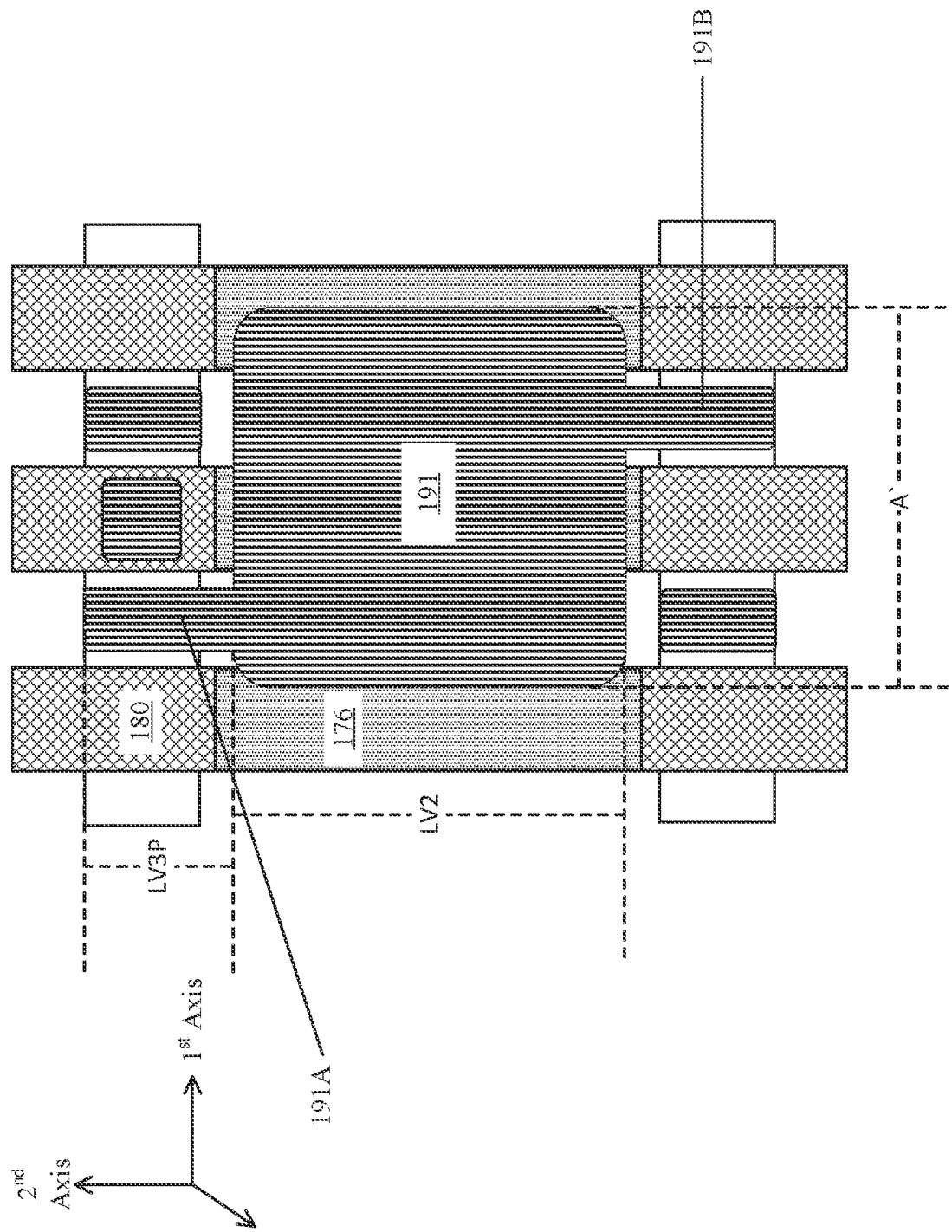

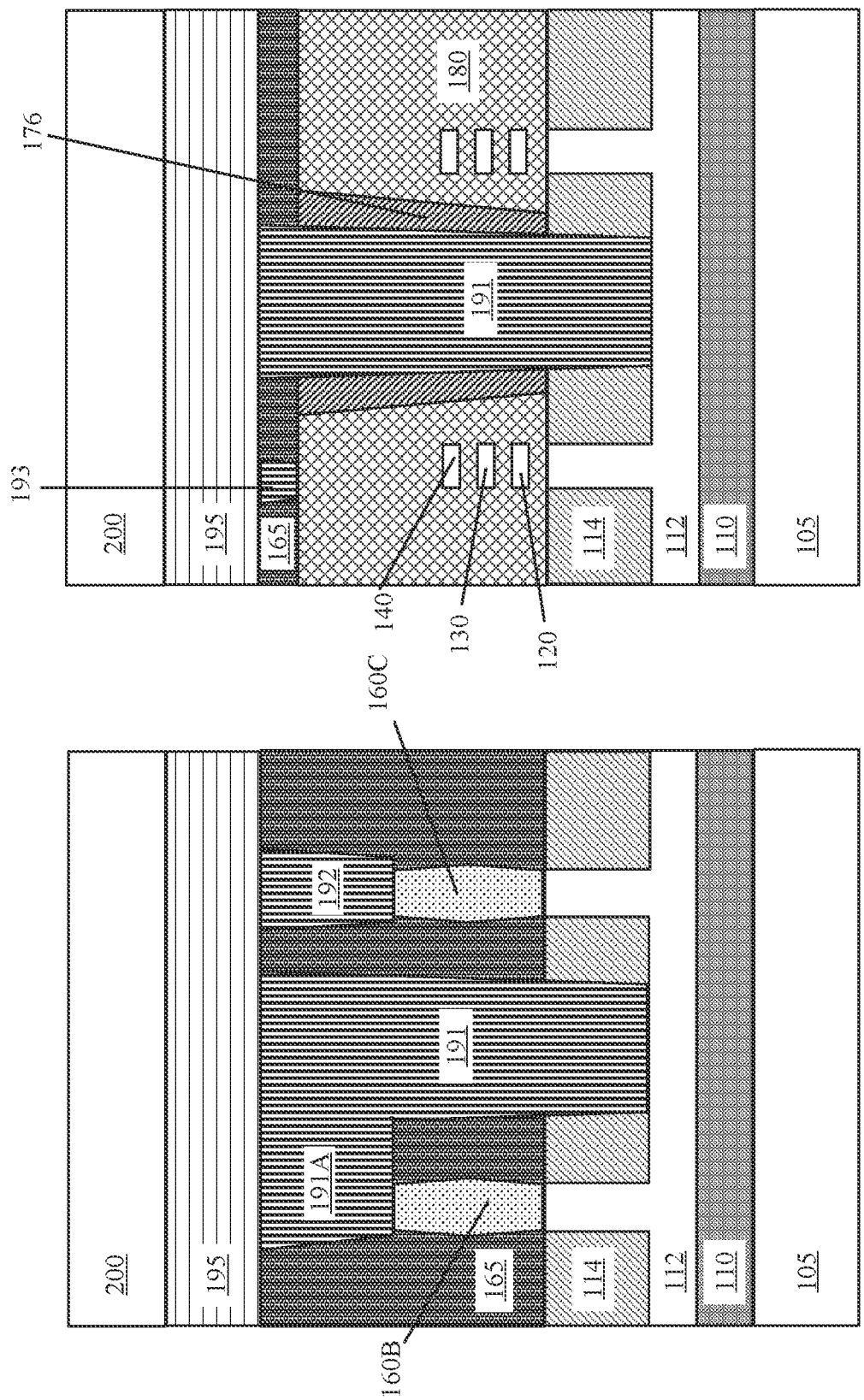

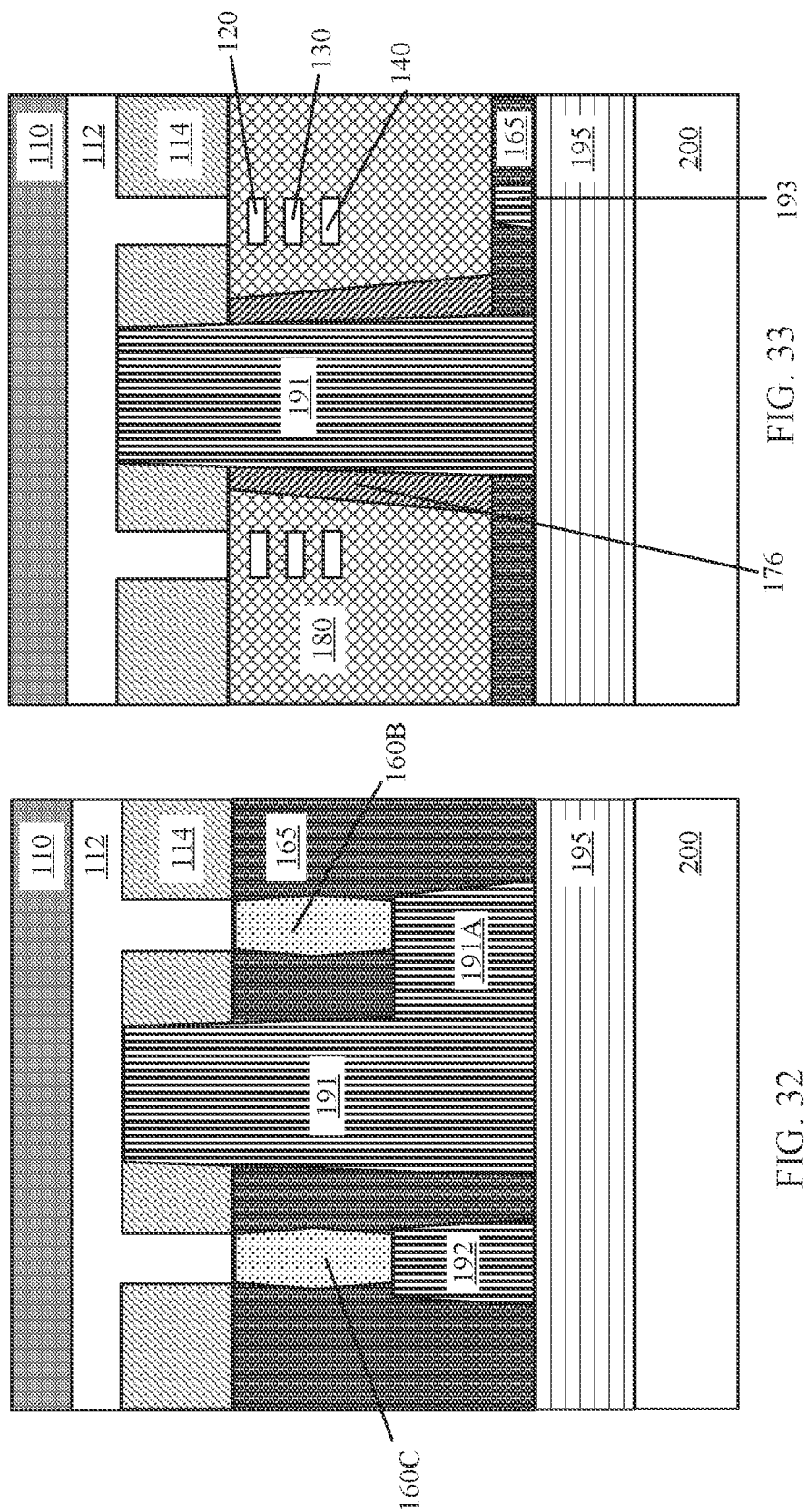

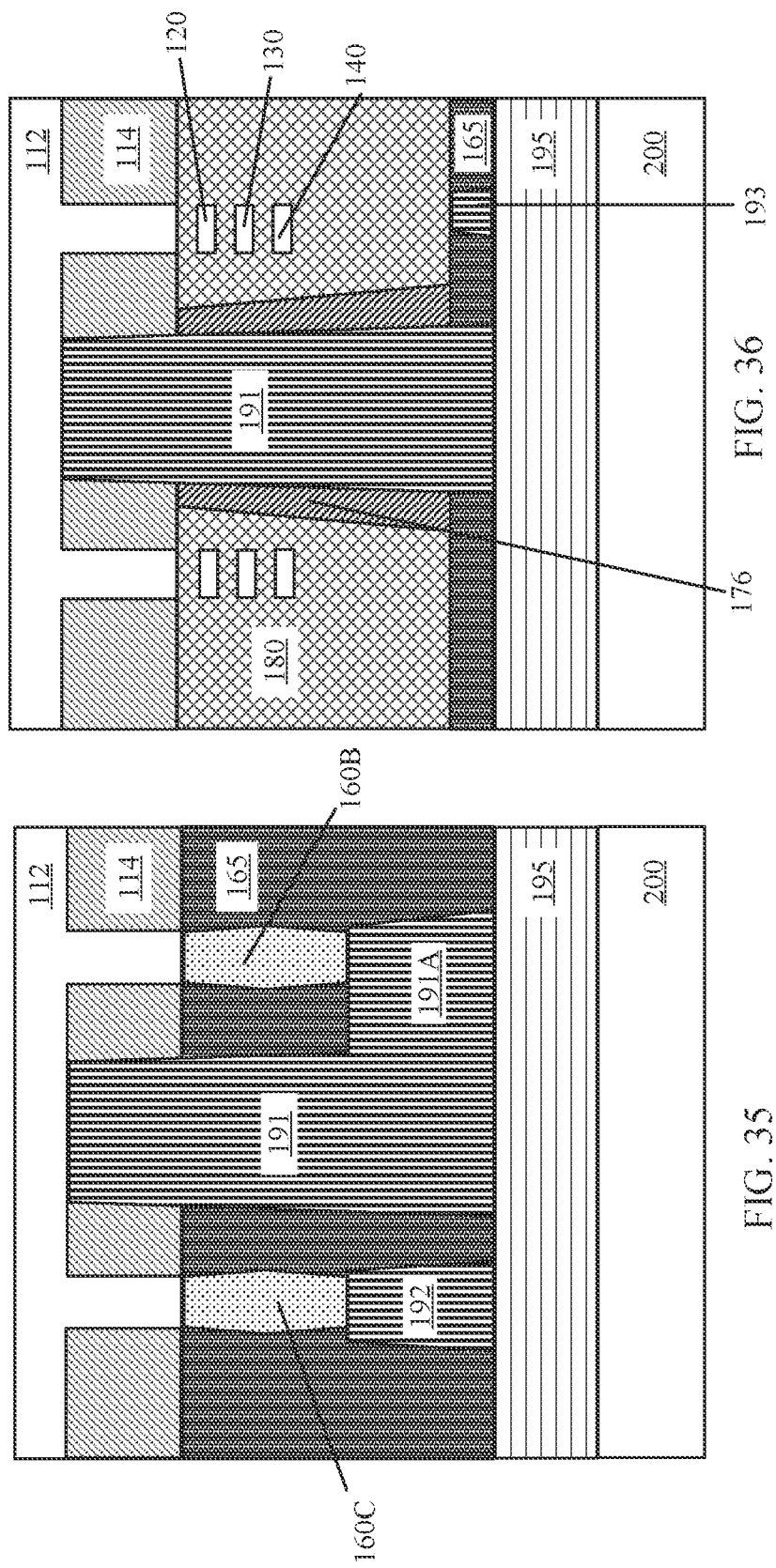

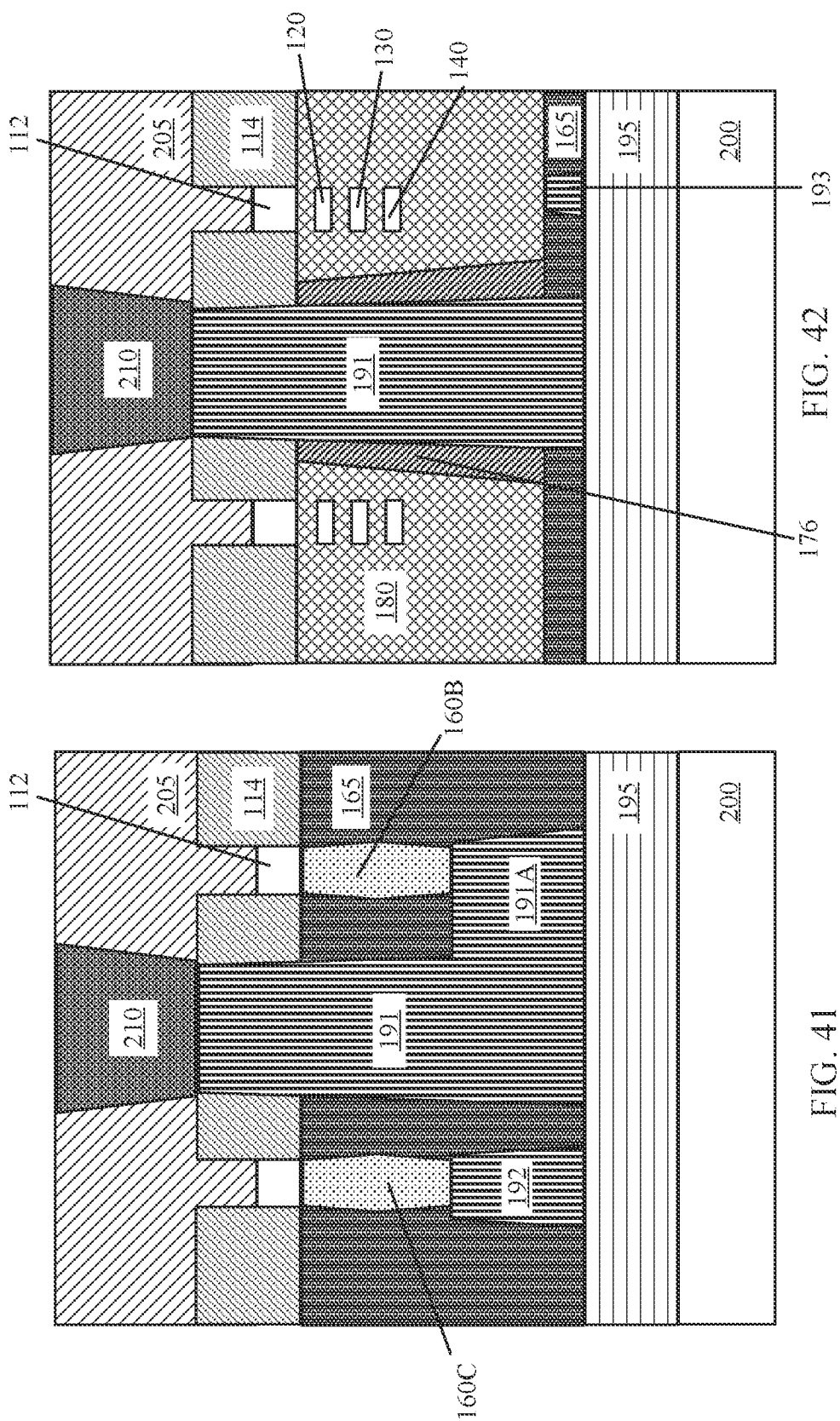

DIFFERENT DIMENSIONS ACROSS ACTIVE REGION FOR STRONGER VIA TO BACKSIDE POWER RAIL

BACKGROUND

The present invention relates generally to the field of microelectronics, and more particularly to a semiconductor device structure, and a method for forming a semiconductor device.

A nanosheet (NS) is the lead device architecture in continuing CMOS scaling. However, nanosheet technology has shown issues when scaling down such that as the devices become smaller and closer together, they are interfering with each other. Furthermore, as the devices become smaller and closer together, forming the connections to a backside power network is becoming more difficult.

SUMMARY

According to the embodiment of the present invention, a semiconductor device includes a first nanodevice and a second nanodevice. The first nanodevice is comprised of a plurality of first transistors. The second nanodevice is comprised of a plurality of second transistors. The second nanodevice is located adjacent to and parallel to the first nanodevice. The first nanodevice includes a first section, a second section, and a third section. The second nanodevice includes a first section, a second section, and a third section. The first section of the first nanodevice and the first section of the second nanodevice are spaced apart from each other by a first distance. The second section of the first nanodevice and the second section of the second nanodevice are spaced apart from each other by a second distance. The third section of the first nanodevice and the third section of the second nanodevice are spaced apart from each other by a third distance. The second distance is greater than the first distance. The first distance is substantially equal to the third distance.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIGS. 8-10 illustrate cross sections X, $Y_1$, and $Y_2$, respectively, of the plurality of nanodevices after the formation of a lithography mask layer, in accordance with the embodiment of the present invention.

FIGS. 12-14 illustrate cross sections X, $Y_1$, and $Y_2$, respectively, of the plurality of nanodevices after the formation of the first gate cut dielectric pillar and the second gate cut dielectric pillar, in accordance with the embodiment of the present invention.

FIGS. 18-20 illustrate cross sections X, $Y_1$, and $Y_2$, respectively, of the plurality of nanodevices after the formation of a trench, in accordance with the embodiment of the present invention.

FIGS. 21B and 21C illustrate a magnified top-down view of different portions of the plurality of nanodevices illustrated in FIG. 21A.

FIGS. 25-27 illustrate cross sections X, $Y_1$, and $Y_2$, respectively, of the plurality of nanodevices after the formation of a back-end-of-line (BEOL) layer and bonding to a carrier wafer, in accordance with the embodiment of the present invention.

FIGS. 31-33 illustrate cross sections X, $Y_1$, and $Y_2$, respectively, of the plurality of nanodevices after the removal of the substrate, in accordance with the embodiment of the present invention.

FIGS. 34-36 illustrate cross sections X, $Y_1$, and $Y_2$, respectively, of the plurality of nanodevices after the removal of the etch stop layer, in accordance with the embodiment of the present invention.

FIGS. 40-42 illustrate cross sections X, $Y_1$, and $Y_2$, respectively, of the plurality of nanodevices after the formation of a backside power rail (BPR), in accordance with the embodiment of the present invention.

DETAILED DESCRIPTION

Figure 1:
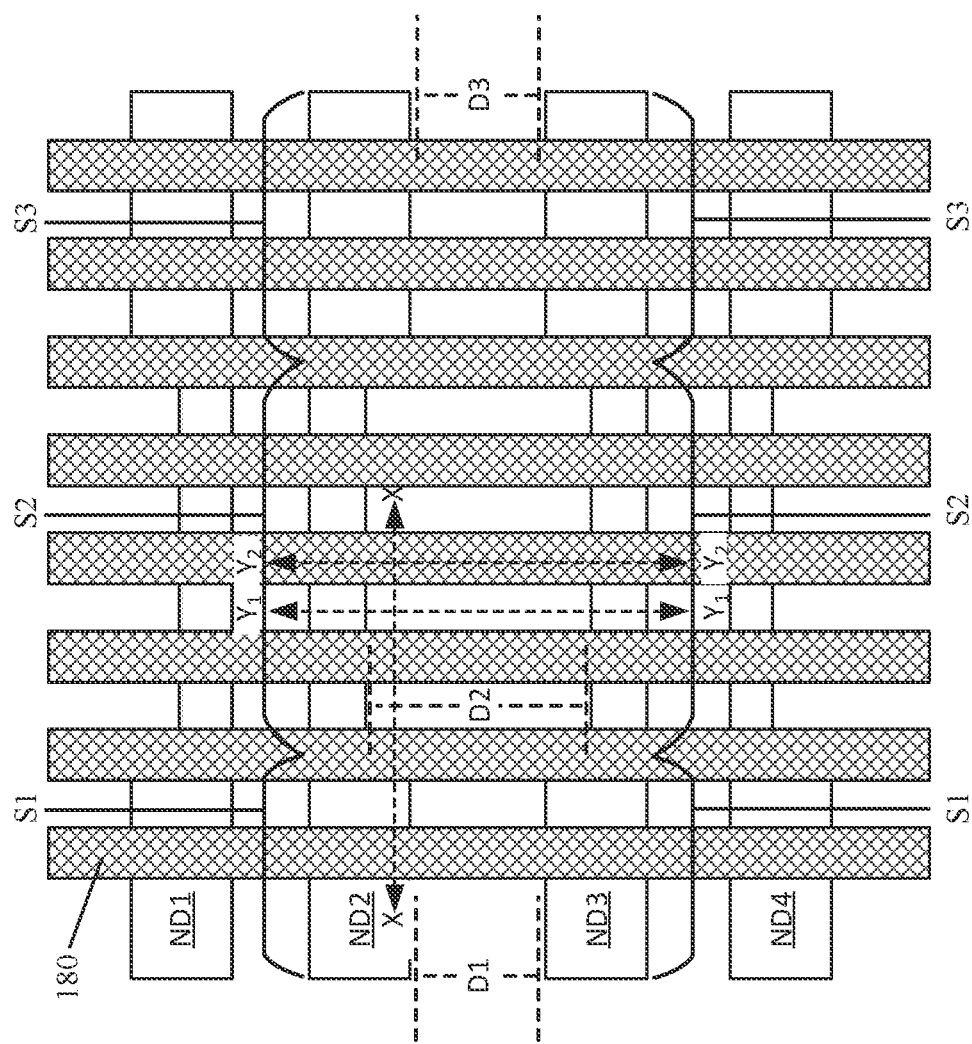
FIG. 1 illustrates a top-down view of a plurality of nanodevices, in accordance with the embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

References in the specification to "one embodiment," "an embodiment," "an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "formed on," or "formed atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be a direct or indirect positional relationship. As an example of an indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both an indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes which are used to form a micro-chip that will be packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout.

When a via extends downwards from a frontside contact the via may be located between two active regions on a nanodevice. The downwards extending via is connected to a component, for example, a backside power rail. The size of the via is limited by a contact component/gate piece. For example, when a space between P-Channel Field Effect Transistors (PFET) and/or N-Channel Field Effect Transistors (NFET) remains constant, there are no additional benefits for the via.

By increasing the space between PFET and/or NFET transistors, the via to the backside power rail (VBPR) may be enlarged, thus forming a stronger VBPR.

The present invention is directed to forming different dimensions across active regions for a plurality of nanodevices (e.g., PFET and/or NFET transistors) such that the space between middle portions of the nanodevices enables an enlarged VBPR to connect to a backside power rail (BPR). The plurality of nanodevices include a first section, a second section, and a third section, where the first section has a first distance between two nanodevices, the second section has a second distance between two nanodevices, and the third section has a third distance between two nanodevices. According to the embodiment of the present invention, the first distance and the third distance may be substantially equivalent, and the second distance may be greater than each of the first distance and the third distance. The enlarged VBPR may be formed in the space between the second sections of the plurality of nanodevices.

FIG. 1 illustrates a top-down view of a plurality of nanodevices ND1, ND2, ND3, ND4, in accordance with the embodiment of the present invention. The adjacent devices include a first nanodevice ND1 comprised of a plurality of first transistors, a second nanodevice ND2 (i.e., the first nanodevice in the claims) comprised of a plurality of second transistors, a third nanodevice ND3 (i.e., the second nanodevice in the claims) comprised of a plurality of third transistors, and a fourth nanodevice ND4 comprised of a plurality of fourth transistors. Cross-section X is a cross section perpendicular to the gates along the horizontal axis of the second nanodevice ND2. Cross-section $Y_1$ is a cross section parallel to the gates in the source/drain region across the plurality of nanodevices ND1, ND2, ND3, ND4. Cross-section $Y_2$ is a cross section parallel to the gates in the gate region across the plurality of nanodevices ND1, ND2, ND3, ND4. It may be appreciated that the embodiment of the present invention is not limited to nanodevices ND1, ND2, ND3, ND4 and that other devices including, but not limited to, FinFET, nanowire, and a planar device may also be used.

The plurality of nanodevices ND1, ND2, ND3, ND4 include a first section S1, a second section S2, and a third section S3. The first section S1 has a first distance D1 between two nanodevices (e.g., ND2, ND3), the second section S2 has a second distance D2 between two nanodevices ND2, ND3, and the third section S3 has a third distance D3 between two nanodevices ND2, ND3. The second section of the second nanodevice ND2 is located between the first section and the third section of the second nanodevice ND2, and the second section of the second nanodevice ND2 defines a cut-out facing the second section of the third nanodevice ND3. The second section of the third nanodevice ND3 is located between the first section and the third section of the third nanodevice ND3, and the second section of the third nanodevice ND3 defines a cut-out facing the second section of the second nanodevice ND2. The first distance D1 and the third distance D3 may be substantially equivalent to each other. The second distance D2 may be greater than each of the first distance Dl and the third distance D3. For example, the nanodevice ND2 has a first width W1 in the first section S1 and the third section S3. The nanodevice ND2 has a second width W2 in the second section S2. The first width W1 is larger than the second width W2. The nanodevice ND3 has a mirrored orientation to the nanodevice ND2. Thus, the second distance D2 is greater than the first distance D1 and the third distance D3. It may be appreciated that FIG. 1 is intended for illustrative purposes only, and that in the embodiment of the present invention the sections S1, S2, S3 and the distances D1, D2, D3 may be sections of and distances between other nanodevices such as, for example, ND4 and ND5 (not shown). It may also be appreciated that first gate cut dielectric pillars 175 and second gate cut dielectric pillars 176 are located in the space between cell boundaries to isolate gates 180 between neighboring CMOS cells.

Figure 2:
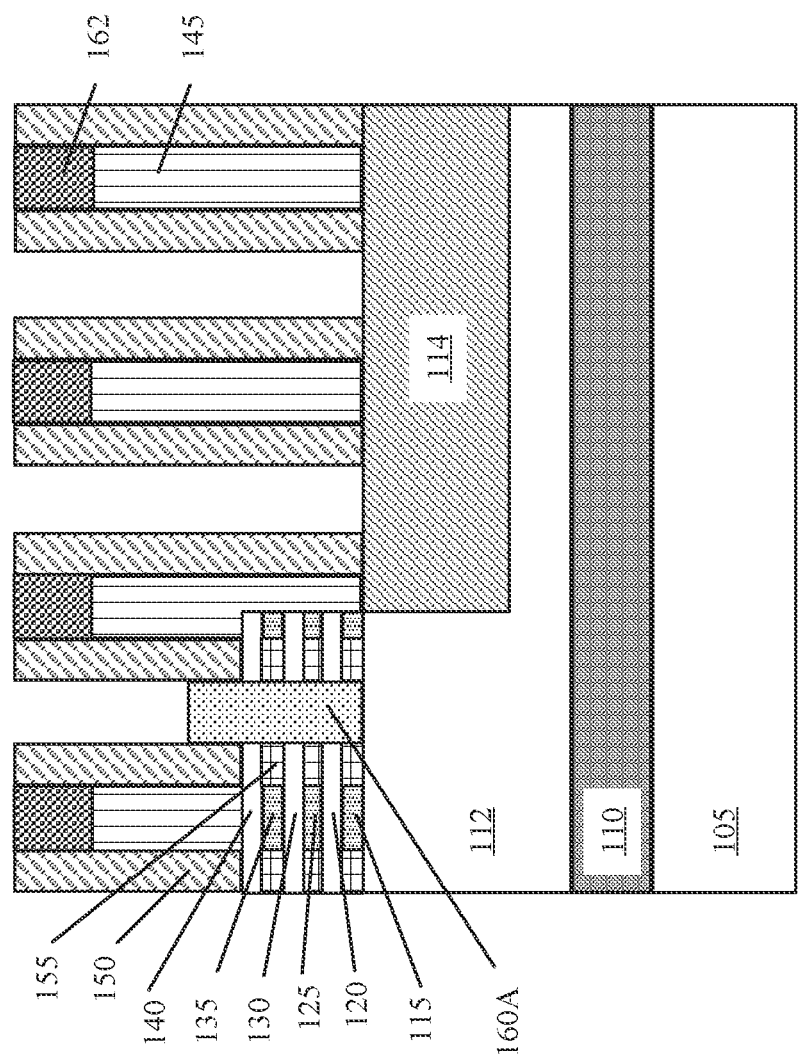
FIGS. 2-4 illustrate cross sections X, $Y_1$, and $Y_2$, respectively, of the plurality of nanodevices after nanosheet formation, shallow trench isolation (STI) region formation, dummy gate formation, gate hard mask formation, gate spacer and inner spacer formation, and source/drain formation, in accordance with the embodiment of the present invention.
Figure 4:
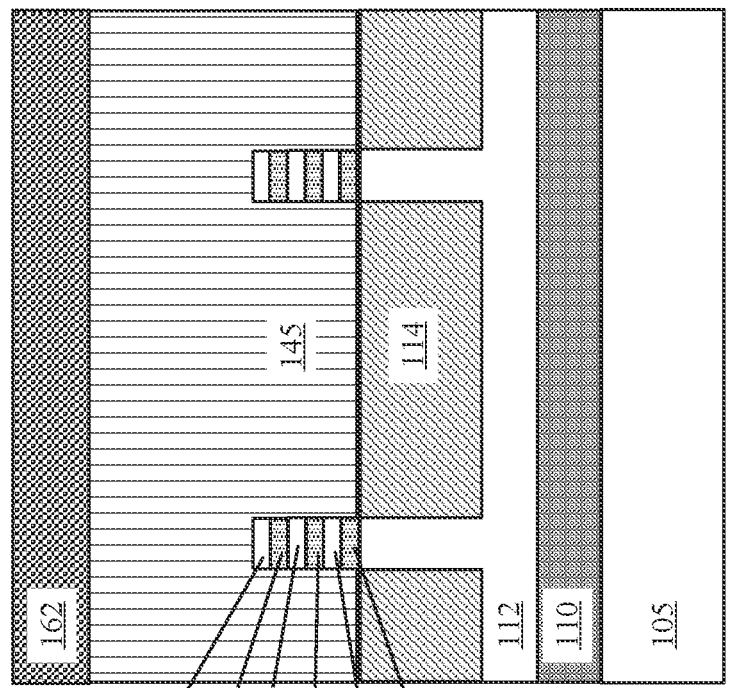
Figure 3:
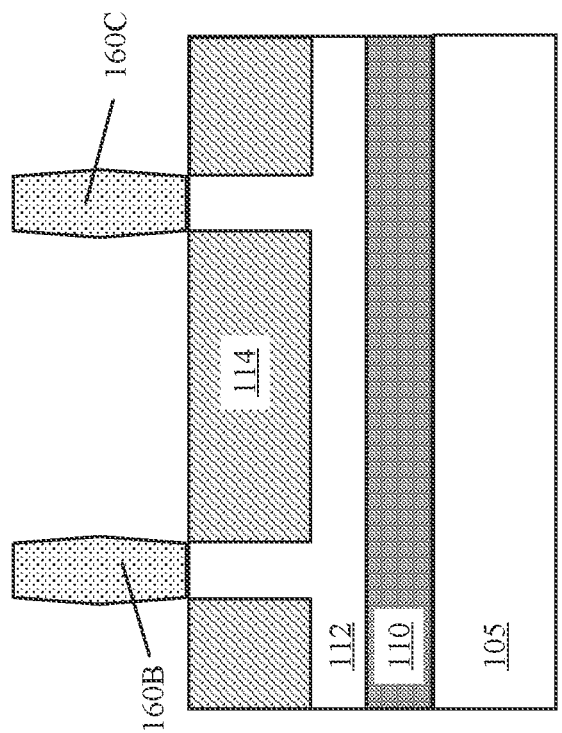

FIGS. 2-4 illustrate cross sections X, $Y_1$, and $Y_2$, respectively, of the plurality of nanodevices ND1, ND2, ND3, ND4 after nanosheet 120, 130, 140 formation, shallow trench isolation (STI) region 114 formation, dummy gate 145 formation, gate hard mask 162 formation, gate spacer 150 and inner spacer 155 formation, and source/drain 160A, 160B, 160C formation, in accordance with the embodiment of the present invention.

The plurality of nanodevices ND1, ND2, ND3, ND4 include a substrate 105, an etch stop layer 110, an underlying substrate layer 112, an STI region 114, a first sacrificial layer 115, a first nanosheet 120, a second sacrificial layer 125, a second nanosheet 130, a third sacrificial layer 135, a third nanosheet 140, a dummy gate 145, a gate spacer 150, an inner spacer 155, a first source/drain 160A, a second source/drain 160B, a third source/drain 160C, and a gate hard mask 162. The substrate 105 and the etch stop layer 110 can be, for example, a material including, but not necessarily limited to, silicon (Si), silicon germanium (SiGe), Si:C (carbon doped silicon), carbon doped silicon germanium (SiGe:C), II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 and the etch stop layer 110 may be doped, undoped or contain doped regions and undoped regions therein.

In FIG. 2, the first sacrificial layer 115 is formed directly atop the underlying substrate layer 112. The first nanosheet 120 is formed directly atop the first sacrificial layer 115. The second sacrificial layer 125 is formed directly atop the first nanosheet 120. The second nanosheet 130 is formed directly atop the second sacrificial layer 125. The third sacrificial layer 135 is formed directly atop the second nanosheet 130. The third nanosheet 140 is formed directly atop the third sacrificial layer 135. The first sacrificial layer 115, the second sacrificial layer 125, and the third sacrificial layer 135 are hereinafter referred to as the plurality of sacrificial layers 115, 125, 135. In addition, the first nanosheet 120, the second nanosheet 130, and the third nanosheet 140 are hereinafter referred to as the plurality of nanosheets 120, 130, 140. The plurality of sacrificial layers 115, 125, 135 may be comprised of, for example, SiGe, where Ge is about 35%. The plurality of nanosheets 120, 130, 140 may be comprised of, for example, Si. The number of nanosheets and the number of sacrificial layers described above are not intended to be limiting, and it may be appreciated that in the embodiment of the present invention the number of nanosheets and the number of sacrificial layers may vary. After formation of the plurality of nanosheets 120, 130, 140 and the plurality of sacrificial layers 115, 125, 135, together the nanosheet stack, the nanosheet stack may be further patterned using conventional lithography and etching processes, followed by STI region 114 formation by dielectric filling, CMP, and dielectric recess.

The dummy gate 145 is formed directly over the plurality of nanosheets 120, 130, 140 and the STI region 114. In FIGS. 2 and 4, the gate hard mask 162 is formed directly atop the dummy gate 145. In FIG. 2, the gate spacer 150 is formed on both sides of the dummy gate 145 and the gate hard mask 162. Then, the exposed nanosheets 120, 130, 140 are recessed, followed by selective SiGe indentation to create cavities in the sacrificial layers 115, 125, 135. The inner spacer 155 is then formed inside the cavities. In FIGS. 2 and 3, the first source/drain 160A, the second source/drain 160B, and the third source/drain 160C grow from exposed surfaces of the nanosheets 120, 130, 140. The first source/drain 160A, the second source/drain 160B, and the third source/drain 160C are formed directly atop the underlying substrate layer 112.

The first source/drain 160A, the second source/drain 160B, and the third source/drain 160C can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 5:
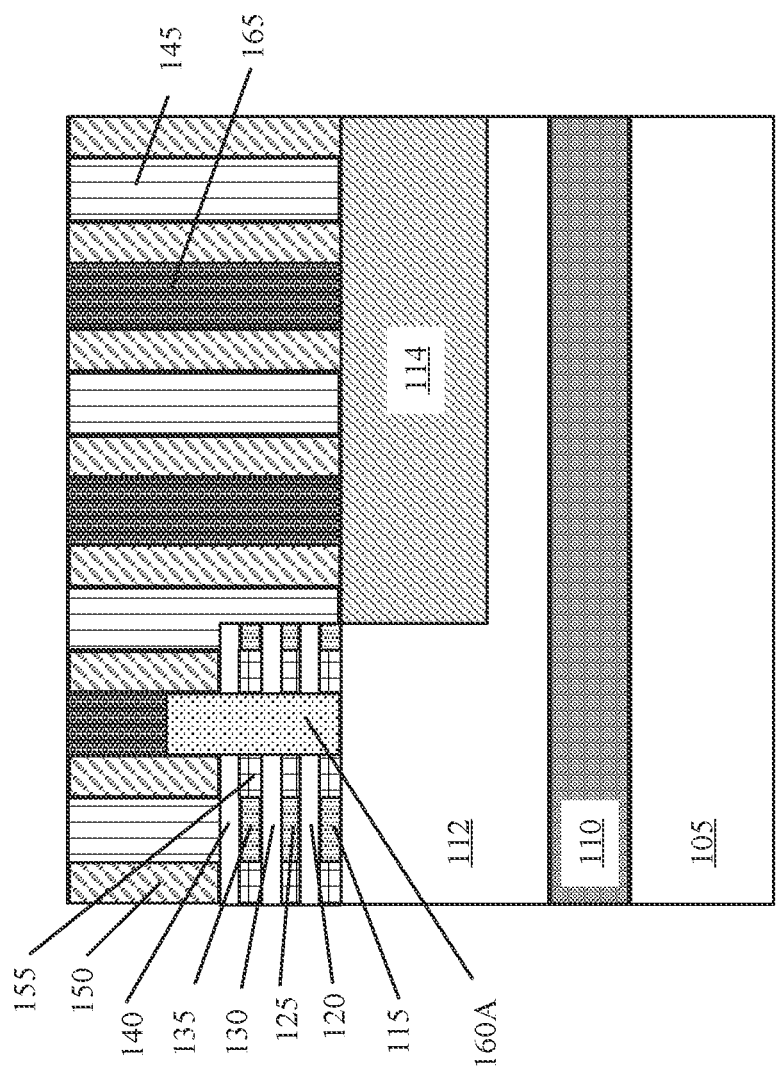
FIGS. 5-7 illustrate cross sections X, $Y_1$, and $Y_2$, respectively, of the plurality of nanodevices after interlayer dielectric (ILD) deposition and chemical-mechanical planarization (CMP), in accordance with the embodiment of the present invention.
Figure 7:
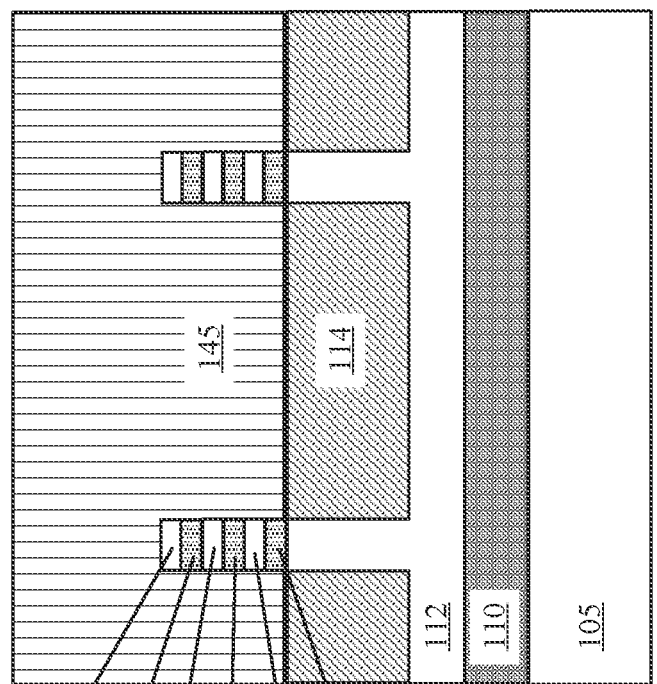
Figure 6:
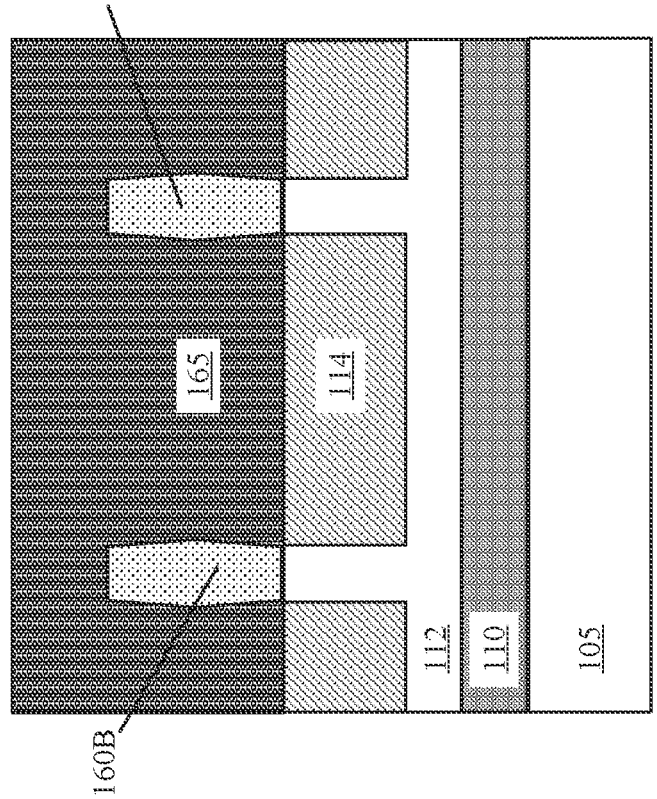

FIGS. 5-7 illustrate cross sections $X_1$, $X_2$, and Y, respectively, of the plurality of nanodevices ND1, ND2, ND3, ND4 after interlayer dielectric (ILD) 165 deposition and chemical-mechanical planarization (CMP), in accordance with the embodiment of the present invention. In FIG. 5, the ILD 165 is formed directly atop the first source/drain 160A and the STI region 114, and surrounds one side of the gate spacer 150. In FIG. 6, the ILD 165 is formed directly atop the second source/drain 160B, the third source/drain 160C, and the STI region 114. Then, in FIGS. 5 and 7, the gate hard mask 162 is removed by, for example, CMP, stopping on the dummy gate 145.

Figure 8:
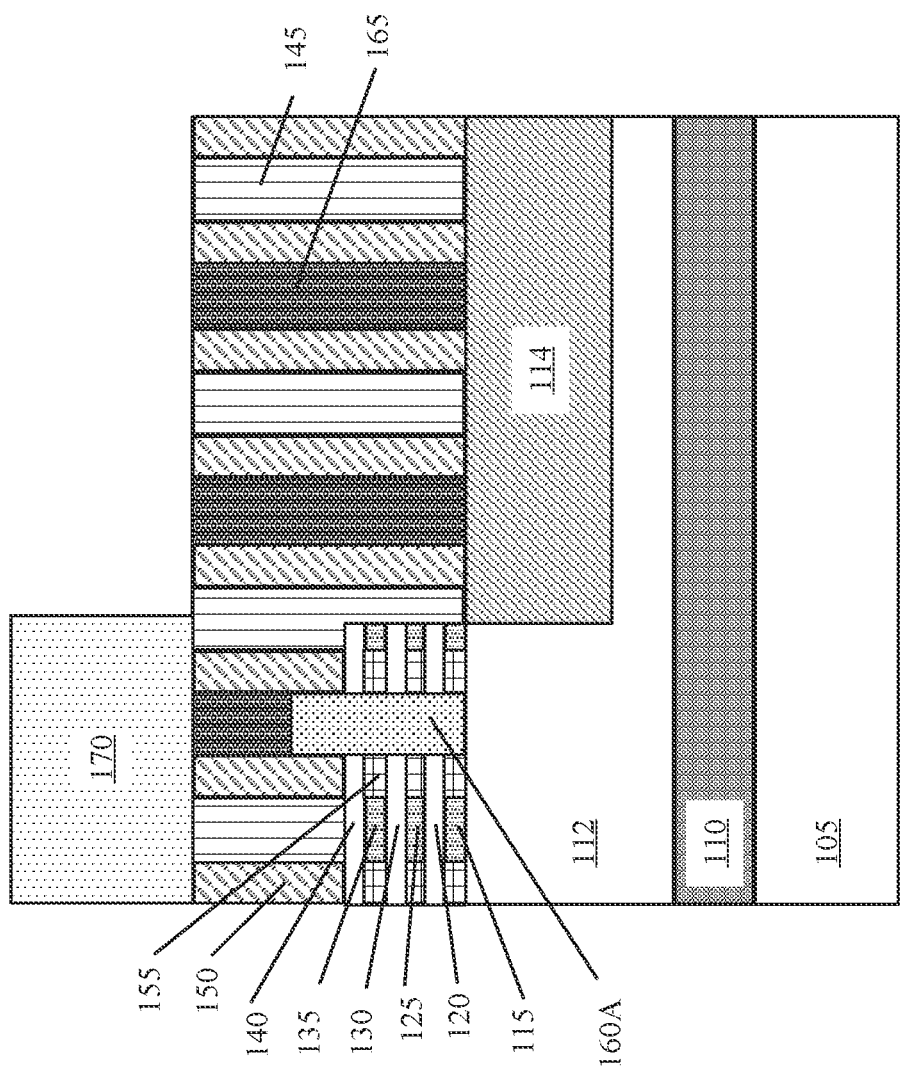

FIGS. 8-10 illustrate cross sections X, $Y_1$, and $Y_2$, respectively, of the plurality of nanodevices ND1, ND2, ND3, ND4 after the formation of a lithography mask layer 170, in accordance with the embodiment of the present invention. In FIG. 8, the lithography mask layer 170, for example, an organic planarization layer (OPL), is deposited and then patterned directly atop the dummy gate 145, the gate spacer 150, and the ILD 165 to expose a portion of the underlying ILD 165, the dummy gate 145, and the gate spacer 150. In FIG. 9, the lithography mask layer 170 is deposited and then patterned directly atop the ILD 165 to expose a portion of the ILD 165. In FIG. 10, the lithography mask layer 170 is deposited and then patterned directly atop the dummy gate 145 to expose a portion of the dummy gate 145. In FIGS. 8-10, the lithography mask layer 170 is formed by depositing, for example, an OPL material in a spin-on coating process.

Figure 11:
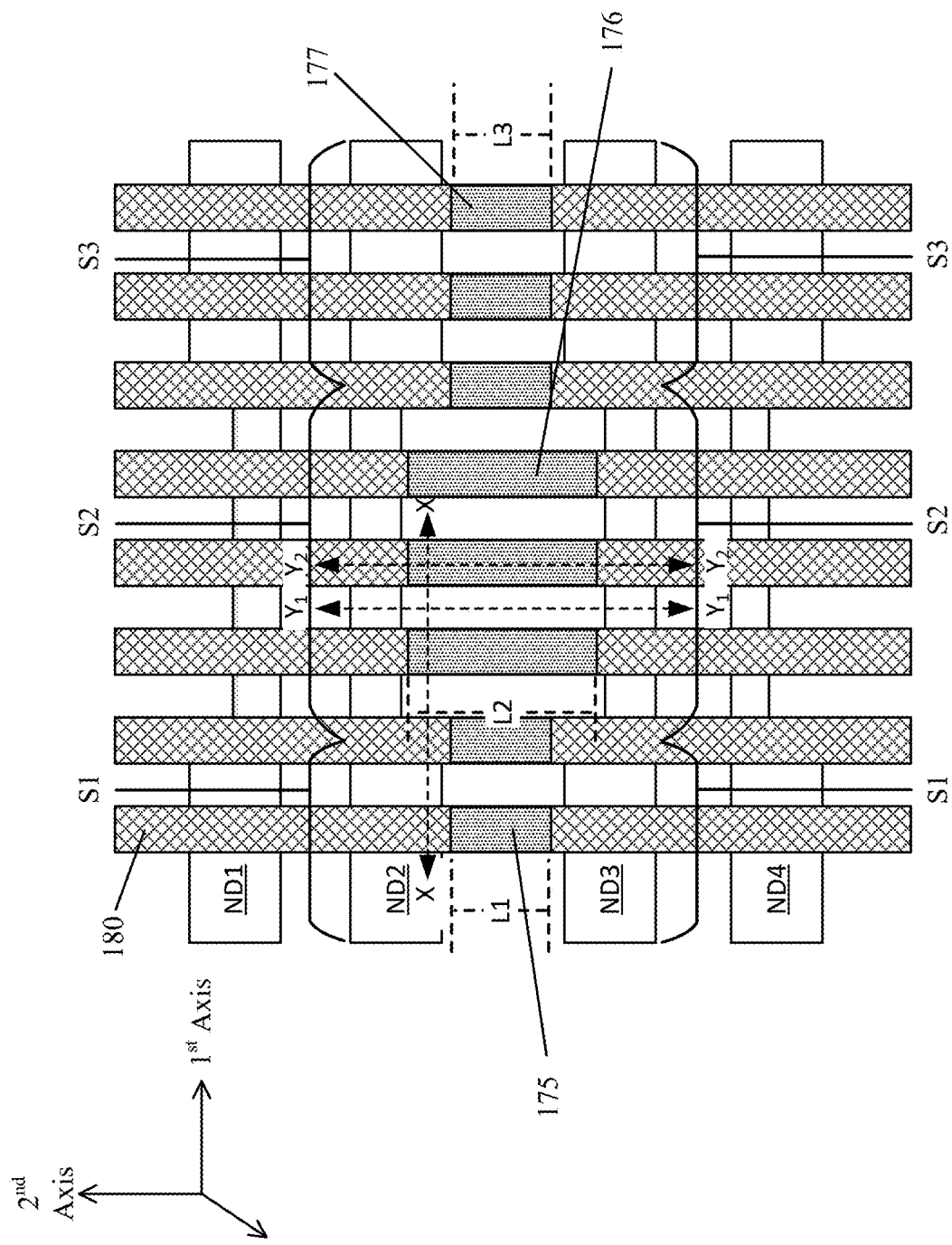
FIG. 11 illustrates a top-down view of the plurality of nanodevices after the formation of a first gate cut dielectric pillar and a second gate cut dielectric pillar, in accordance with the embodiment of the present invention.

FIG. 11 illustrates a top-down view of the plurality of nanodevices ND1, ND2, ND3, ND4 after the formation of first gate cut dielectric pillars 175, second gate cut dielectric pillars 176, and third gate cut dielectric pillars 177, in accordance with the embodiment of the present invention. FIG. 11 is meant to illustrate the formation of three gate cut regions between the second nanodevice ND2 and the third nanodevice ND3. The first gate cut region is located between the first sections S1 of the second nanodevice ND2 and the third nanodevice ND3. The middle gate cut region is located between the second sections S2 of the second nanodevice ND2 and the third nanodevice ND3. The third gate cut region is located between the third sections S3 of the second nanodevice ND2 and the third nanodevice ND3. The middle gate cut region has a length extending along a second axis longer than each of a length of the first gate cut region and a length of the third gate cut region extending along the second axis. The first gate cut dielectric pillars 175 are located between the first sections S1 of the second nanodevice ND2 and the third nanodevice ND3 and the third gate cut dielectric pillars 177 are located between the third sections S3 of the second nanodevice ND2 and the third nanodevice ND3. The first gate cut dielectric pillars 175 between the first sections S1 of the second nanodevice ND2 and the third nanodevice ND3 have a first length L1 extending along the second axis. The third gate cut dielectric pillars 177 between the third sections S3 of the second nanodevice ND2 and the third nanodevice ND3 have a third length L3 extending along the second axis. The first length L1 and the third length L3 may be substantially equivalent to each other. The second gate cut dielectric pillars 176 are located between the second sections S2 of the second nanodevice ND2 and the third nanodevice ND3. The second gate cut dielectric pillars 176 have a second length L2 extending along the second axis. The second length L2 is greater than each of the first length L1 and the third length L3. For example, since the second distance D2 (FIG. 1) is greater than the first distance D1 (FIG. 1) and the third distance D3 (FIG. 1), the second length L2 may be greater than each of the first length L1 and the third length L3. The first length L1 may be less than the first distance D1. The second length L2 may be less than the second distance D2. The third length L3 may be less than the third distance D3. It may be appreciated that FIG. 11 is intended for illustrative purposes only, and that in the embodiment of the present invention the lengths L1, L3 of the first gate cut dielectric pillars 175 and the third gate cut dielectric pillars 177, respectively, and the length L2 of the second gate cut dielectric pillars 176 may be lengths between other nanodevices such as, for example, ND4 and ND5 (not shown).

Figure 12:
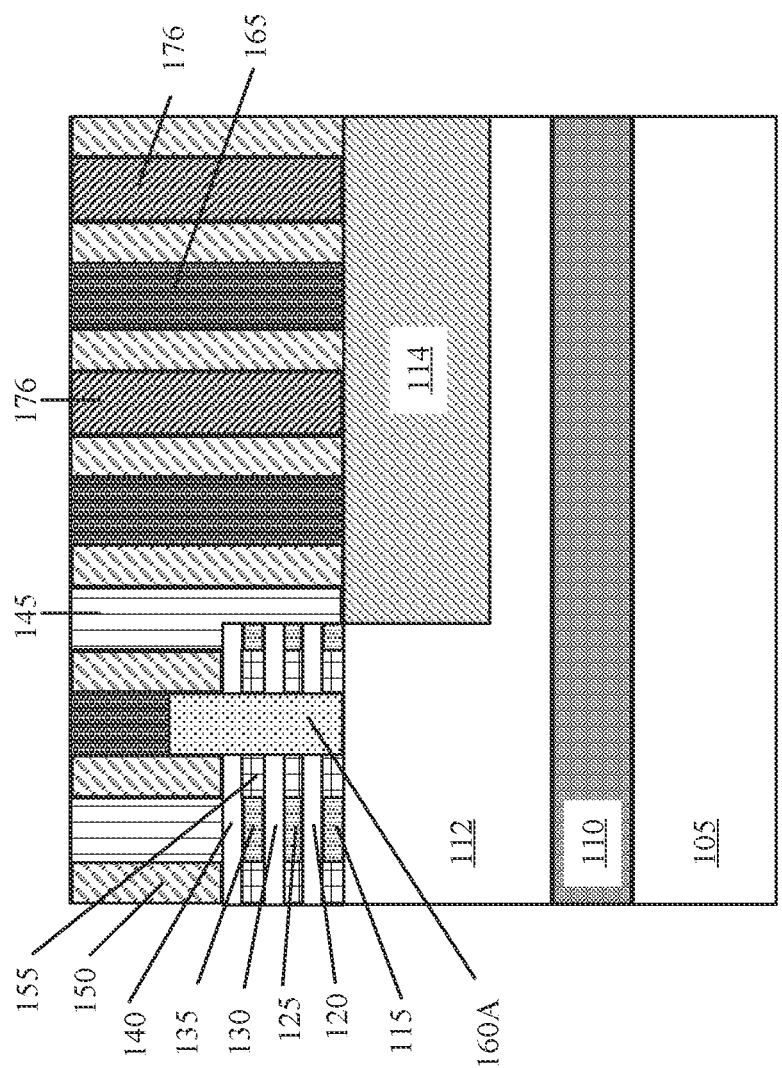

FIGS. 12-14 illustrate cross sections X, $Y_1$, and $Y_2$, respectively, of the plurality of nanodevices ND1, ND2, ND3, ND4 after the formation of the first gate cut dielectric pillar 175 (not shown) and the second gate cut dielectric pillar 176, in accordance with the embodiment of the present invention. The lithography mask layer 170 is removed. In FIG. 12, two dummy gates 145 are removed and a dielectric material is deposited in the space created by the removal of the two dummy gates 145 to form the second gate cut dielectric pillar 176. In FIG. 14, a portion of the dummy gate 145 is removed by, for example, reactive ion etch (ME) and the dielectric material is deposited in the space created by the removal of the portion of the dummy gate 145 to form the second gate cut dielectric pillar 176.

Figure 15:
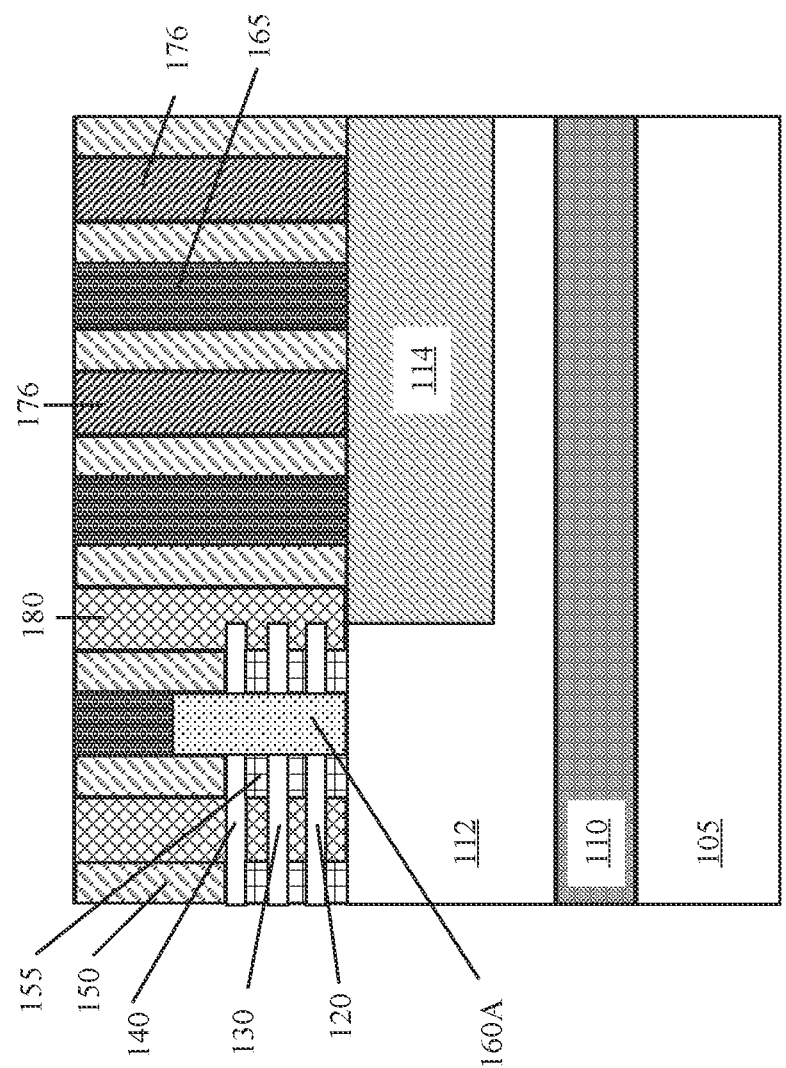
FIGS. 15-17 illustrate cross sections X, $Y_1$, and $Y_2$, respectively, of the plurality of nanodevices after the formation of a gate, in accordance with the embodiment of the present invention.
Figures 16, 17:
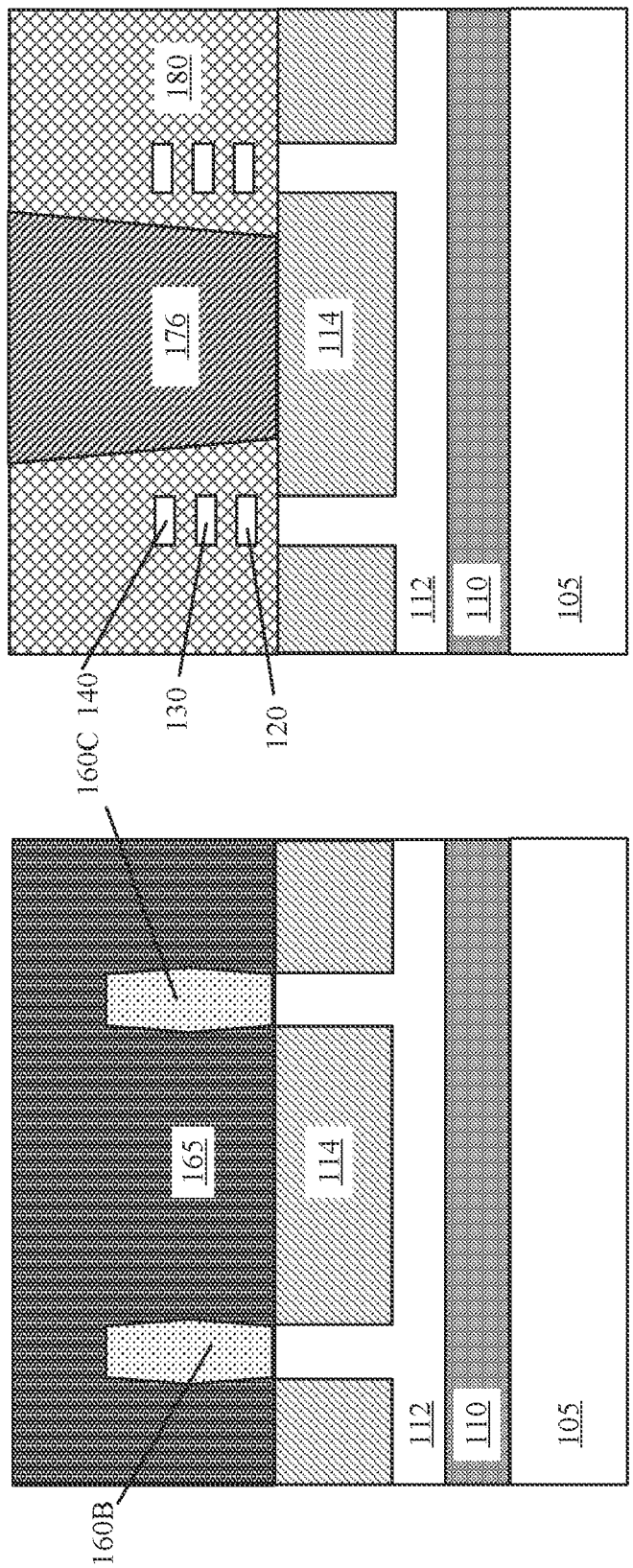

FIGS. 15-17 illustrate cross sections X, $Y_1$, and $Y_2$, respectively, of the plurality of nanodevices ND1, ND2, ND3, ND4 after the formation of a gate 180, in accordance with the embodiment of the present invention. In FIGS. 15 and 17, the dummy gates 145 and the plurality of sacrificial layers 115, 125, 135 are removed. In FIG. 15, a gate material is deposited in the space created by the removal of the dummy gate 145 and sacrificial layers 115, 125, 135 to form a replacement gate (i.e., the gate 180). In FIG. 17, the gate material is deposited in the space created by the removal of the dummy gate 145 to form the gate 180. The gate 180 can be comprised of, for example, a gate dielectric liner, such as a high-k dielectric like HfO2, ZrO2, HfLaOx, etc., and work function layers, such as TiN, TiAlC, TiC, etc., and conductive metal fills, like W.

Figure 18:
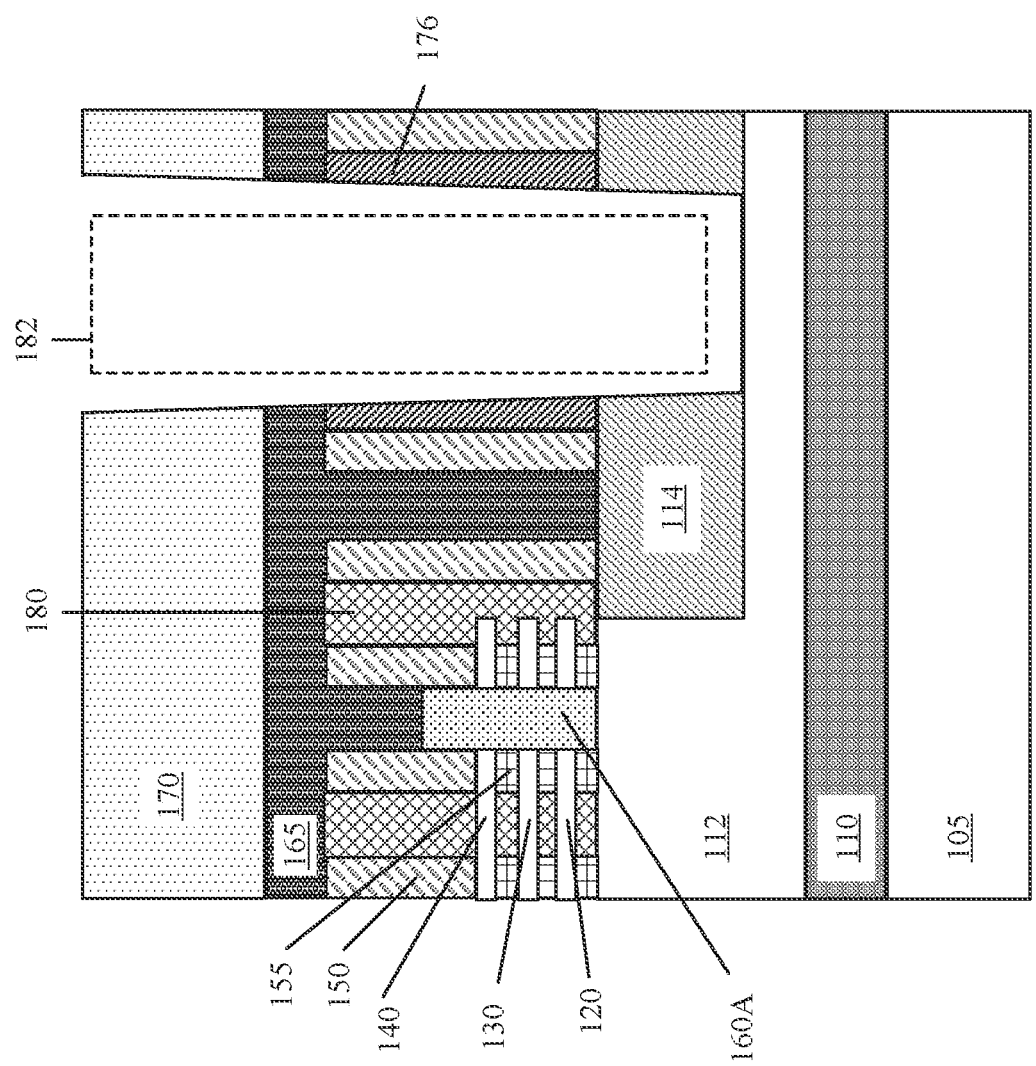

FIGS. 18-20 illustrate cross sections X, $Y_1$, and $Y_2$, respectively, of the plurality of nanodevices ND1, ND2, ND3, ND4 after the formation of a trench 182, in accordance with the embodiment of the present invention. A lithography mask layer 170, for example, an organic planarization layer (OPL), is deposited directly atop the ILD 165. The lithography mask layer 170 is formed by depositing, for example, an OPL material in a spin-on coating process. The lithography mask layer 170 is then patterned to expose a portion of the underlying ILD 165. In FIG. 18, the exposed portion of the ILD 165, a portion of the second gate cut dielectric pillar 176, a portion of the gate spacer 150, and a portion of the STI region 114 are etched to form the trench 182. In FIG. 19, the exposed portion of the ILD 165 is etched to form the trench 182. In FIG. 20, the exposed portion of the ILD 165, a portion of the second gate cut dielectric pillar 176, and a portion of the STI region 114 are etched to form the trench 182. In FIGS. 18-20, a bottom surface of the trench 182 exposes a portion of a top surface of the underlying substrate layer 112.

Figure 21A:
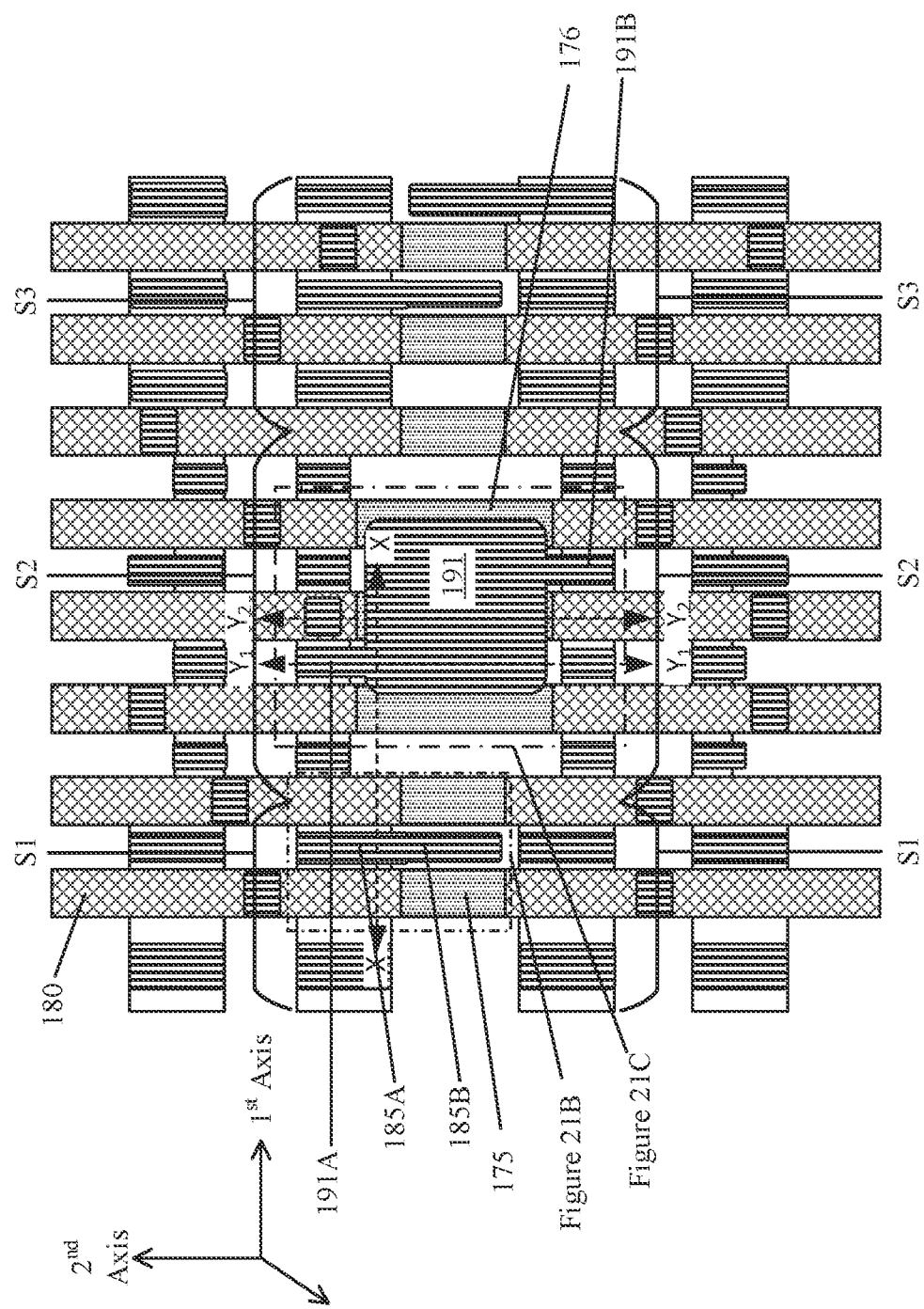
FIG. 21A illustrates a top-down view of the plurality of nanodevices after the formation of a first via to the backside power rail (VBPR) and a second VBPR, in accordance with the embodiment of the present invention.
Figure 22:
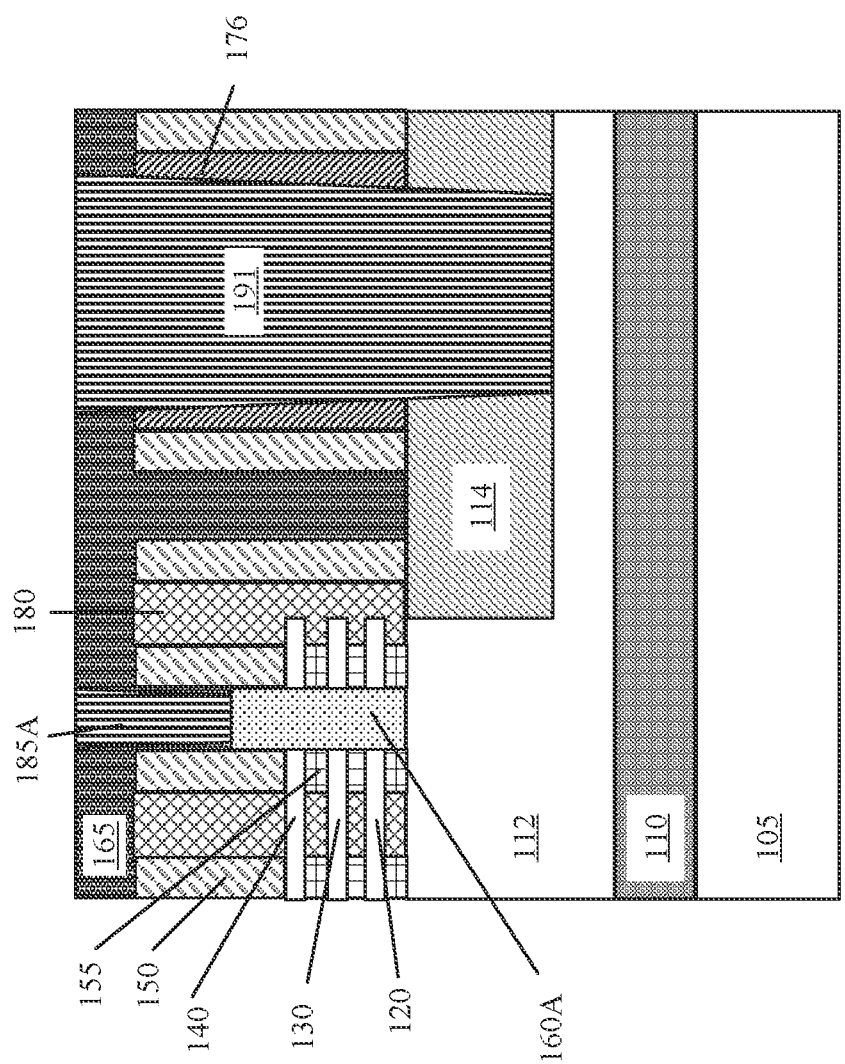
FIGS. 22-24 illustrate cross sections X, $Y_1$, and $Y_2$, respectively, of the plurality of nanodevices after the formation of the first VBPR, the second VBPR, a first source/drain contact, a second source/drain contact, a third source/drain contact, and a gate contact, in accordance with the embodiment of the present invention.
Figures 23, 24:
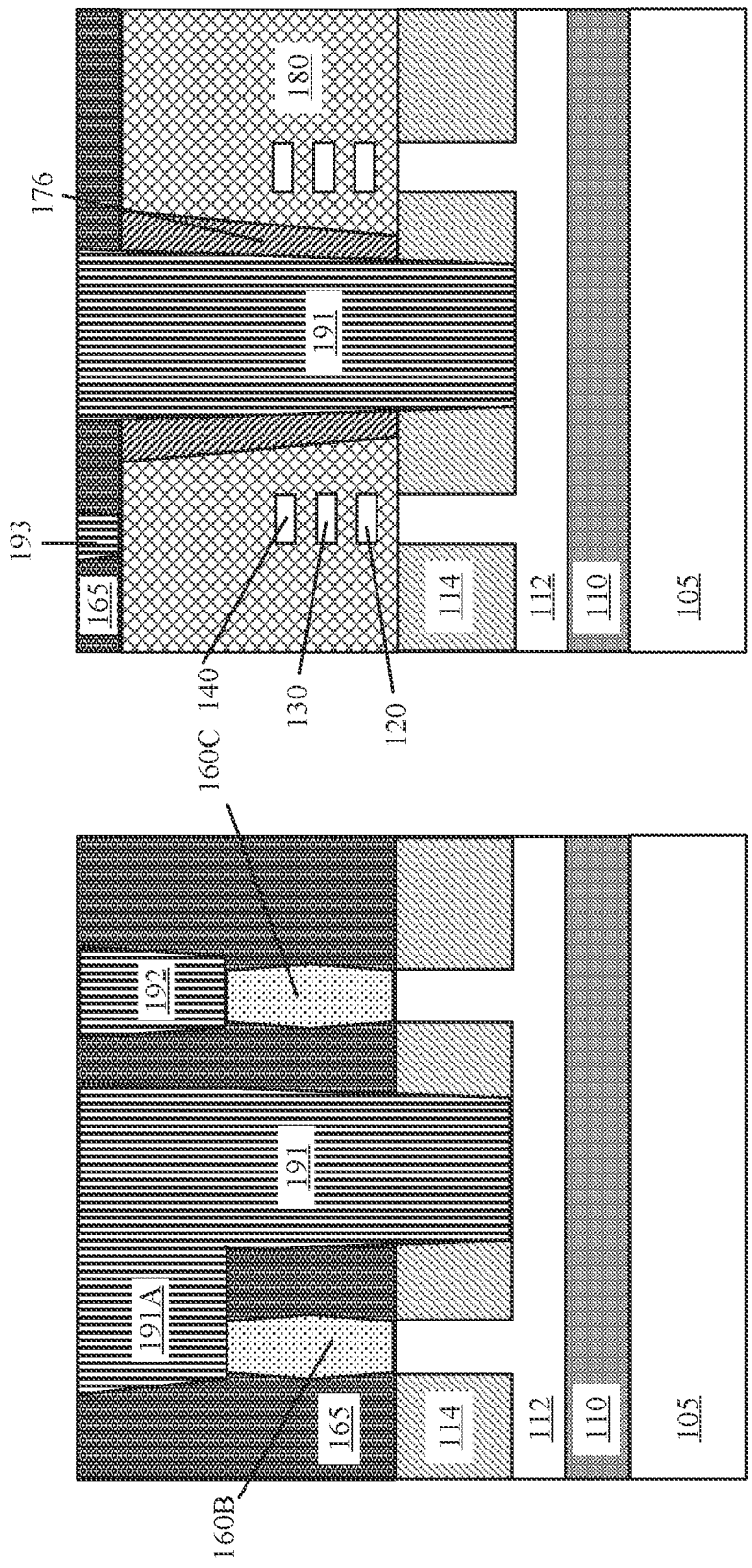

FIG. 21A illustrates a top-down view of the plurality of nanodevices ND1, ND2, ND3, ND4 after the formation of a first section of a first source/drain contact 185A, a second section of the first source/drain contact 185B (i.e., the first VBPR), and a second VBPR 191 in accordance with the embodiment of the present invention. FIG. 21A is meant to illustrate the formation of a plurality of VBPRs 185B, 191 between the second nanodevice ND2 and the third nanodevice ND3. FIGS. 22B and 22C illustrate a magnified top-down view of different portions of the plurality of nanodevices ND1, ND2, ND3, ND4 illustrated in FIG. 21A. In FIG. 21A, the trench 182 is filled with a conductive metal (e.g., including a silicide liner, such as Ni. Ti, NiPt, an adhesion metal liner, such as TiN and conductive metal fill, such as W, Co, or Ru) to form the second VBPR 191 and a plurality of other trenches (not shown) formed during middle-of-line (MOL) patterning are filled with the conductive metal to form the contacts 185A (FIG. 22), 191A (FIG. 23), 192 (FIG. 23) for the source/drains 160A (FIG. 22), 160B (FIG. 23), 160C (FIG. 23), and the gate contact 193 (FIG. 24). The first VBPR 185B is located between the first section S1 of the second nanodevice ND2 and the first section S1 of the third nanodevice ND3. The second VBPR 191 is located between the second section S2 of the second nanodevice ND2 and the second section S2 of the third nanodevice ND3.

FIG. 21B illustrates a magnified top-down view of the first section of the first source/drain contact 185A, the first VBPR 185B, and two first gate cut dielectric pillars 175 between the first section S1 of the second nanodevice ND2 and the first section S1 of the third nanodevice ND3 illustrated in FIG. 21A. The first section of the first source/drain contact 185A and the first VBPR 185B have a first length LV1 extending along the second axis. The first VBPR 185B has a first width A extending laterally along a first axis between two first gate cut dielectric pillars 175. The first VBPR 185B does not overlap the first gate cut dielectric pillars 175. The first VBPR 185B has a length B extending along the second axis. The first length LV1 is greater than the length B.

FIG. 21C illustrates a magnified top-down view of the second VBPR 191 and three second gate cut dielectric pillars 176 between the second section S2 of the second nanodevice ND2 and the second section S2 of the third nanodevice ND3 illustrated in FIG. 21A. The second VBPR 191 has a second length LV2 extending along the second axis. The second VBPR 191 may include a first protrusion 191A (i.e., a second source/drain contact described in further detail below) extending upwards from a top surface of the second VBPR 191 through the second section S2 of the second nanodevice ND2. The first protrusion 191A has a third length LV3P extending along the second axis. The second VBPR 191 may also include a second protrusion 191B extending downwards from a bottom surface of the second VBPR 191 through the second section S2 of the third nanodevice ND3. The second protrusion 191B is also a source/drain contact (not shown). The second length LV2 of the second VBPR 191 is greater than the length B of the first VBPR 185B. For example, since the second length L2 (FIG. 11) is greater than the first length L1 (FIG. 11), the second length LV2 may be greater than the length B (FIG. 21B). The length B (FIG. 21B) may be less than the first length L1 (FIG. 11). The second length LV2 may be less than the second length L2. The second VBPR 191 has a second width A' extending laterally along the first axis through a plurality of the second gate cut dielectric pillars 176. The second width A' of the second VBPR 191 is greater than the first width A of the first VBPR 185B. It may be appreciated that FIG. 21 is intended for illustrative purposes only, and that in the embodiment of the present invention the length LV1 and the length LV2 may be lengths between other nanodevices such as, for example, ND4 and ND5 (not shown).

FIGS. 22-24 illustrate cross sections X, $Y_1$, and $Y_2$, respectively, of the plurality of nanodevices ND1, ND2, ND3, ND4 after the formation of the first VBPR 185B (not shown), the second VBPR 191, a first source/drain contact 185A, a second source/drain contact 191A, a third source/drain contact 192, and a gate contact 193, in accordance with the embodiment of the present invention. The lithography mask layer 170 is removed. In FIG. 22, the first source/drain contact 185A is located directly atop the first source/drain 160A. In FIG. 23, the second source/drain contact 191A includes a first portion and a second portion, where the first portion includes the first protrusion 191A described above in the description of FIG. 21 and is located directly atop the second source/drain 160B. The third source/drain contact 192 is located directly atop the third source/drain 160C. In FIG. 24, the gate contact 193 is located directly atop the gate 180. In FIGS. 22-24, the second VBPR 191 is the downwards extending via of the second source/drain contact 191A extending vertically past the source/drains 160A, 160B, 160C. As used herein, the second VBPR 191 is the second portion of the second source/drain contact 191A. A bottom surface of the second VBPR 191 is in contact with a top surface of the underlying substrate layer 112. In FIGS.

22 and 24, a portion of the sidewalls of the second VBPR 191 is in contact with the STI region 114, the second gate cut dielectric pillar 176, or the ILD 165, respectively. In FIG. 23, a portion of the sidewalls of the second VBPR 191 is in contact with the STI region 114, the ILD 165, or the ILD 165 and the second source/drain contact 191A, respectively.

Figure 25:
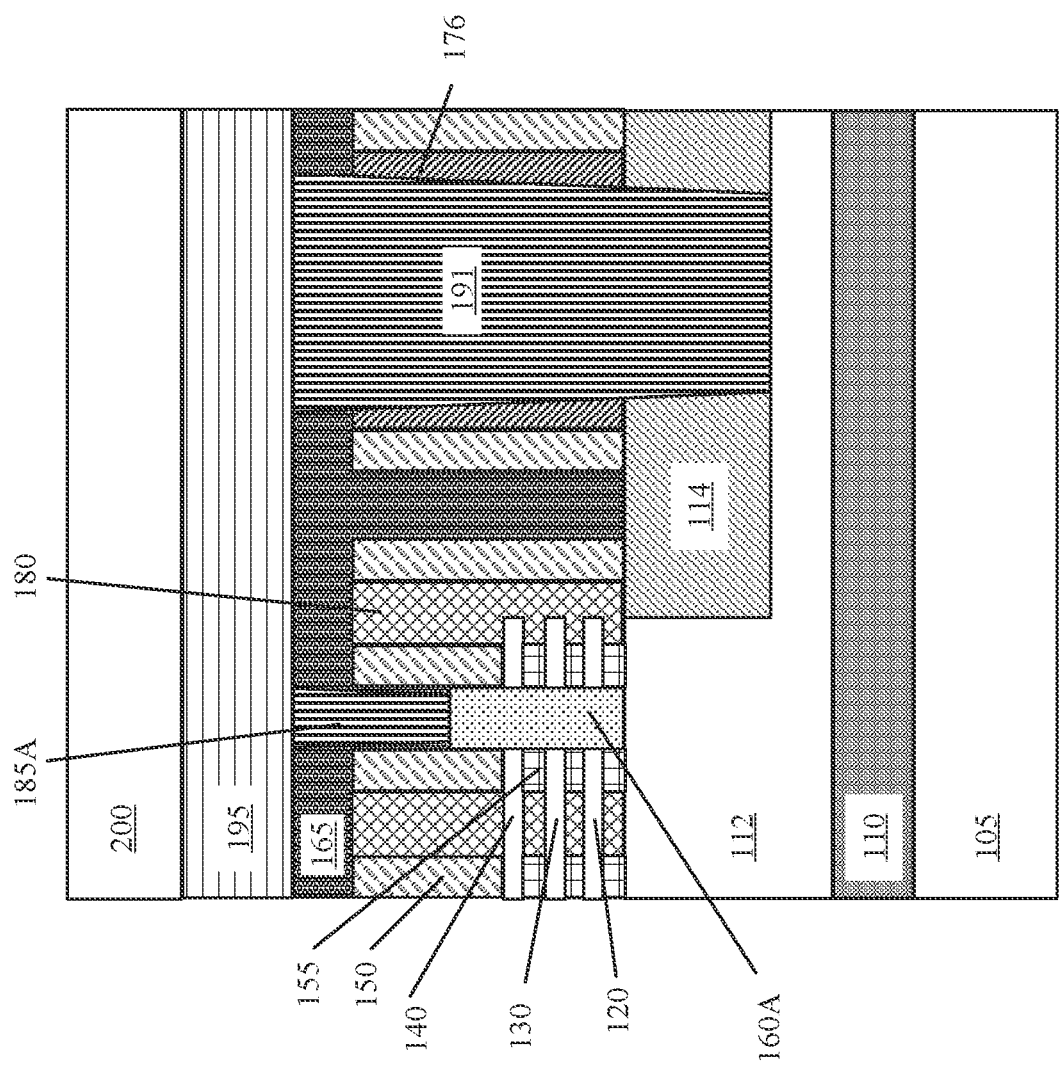

FIGS. 25-27 illustrate cross sections X, $Y_1$, and $Y_2$, respectively, of the plurality of nanodevices ND1, ND2, ND3, ND4 after the formation of a back-end-of-line (BEOL) layer 195 and bonding to a carrier wafer 200, in accordance with the embodiment of the present invention. The BEOL layer 195 may contain multiple metal layers and vias in between. In FIG. 25, the BEOL layer 195 is formed directly atop the ILD 165, the first source/drain contact 185, and the second VBPR 191. In FIG. 26, the BEOL layer 195 is formed directly atop the ILD 165, the second source/drain contact 191A, the second VBPR 191, and the third source/drain contact 192. In FIG. 27, the BEOL layer 195 is formed directly atop the ILD 165, the gate contact 193, and the second VBPR 191. In FIGS. 25-27, the carrier wafer 200 is formed directly atop the BEOL layer 195 by depositing a wafer material on the BEOL layer 195.

Figure 28:
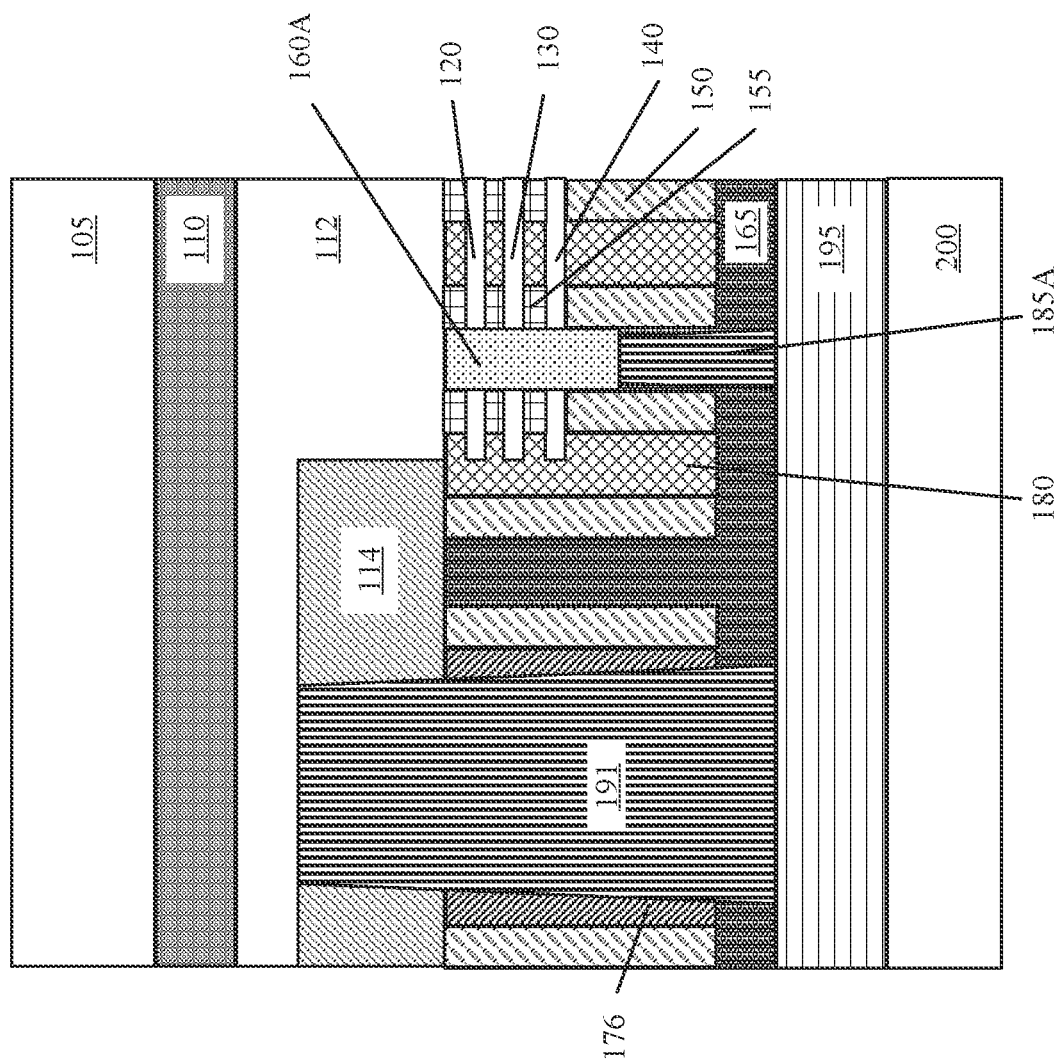
FIGS. 28-30 illustrate cross sections X, $Y_1$, and $Y_2$, respectively, of the plurality of nanodevices after the carrier wafer is flipped, in accordance with the embodiment of the present invention.
Figures 29, 30:
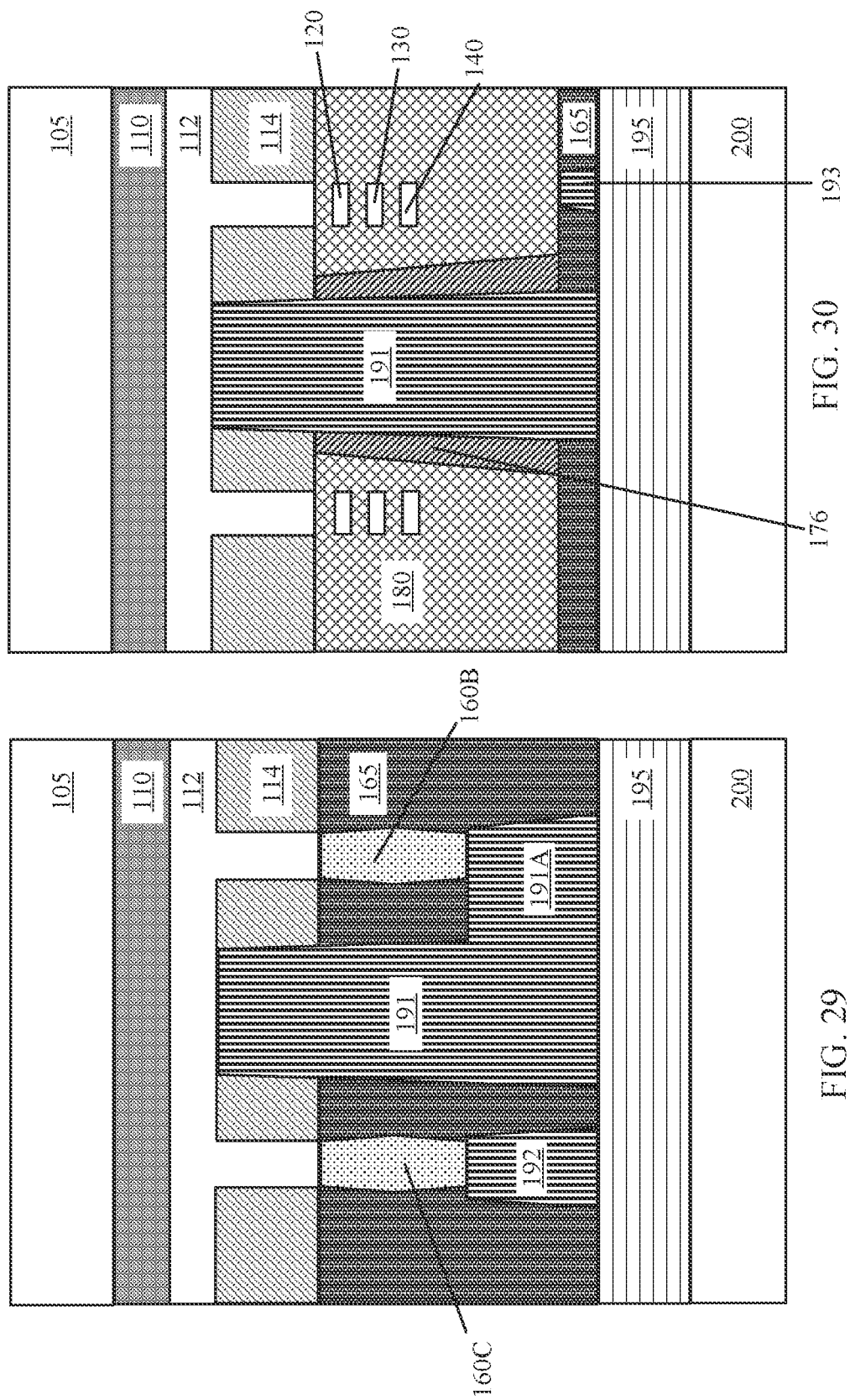

FIGS. 1-27 illustrate the processing of the frontside of the substrate 105, while FIGS. 28-45 illustrate the processing of the backside of the substrate 105. FIGS. 28-30 illustrate cross sections X, $Y_1$, and $Y_2$, respectively, of the plurality of nanodevices ND1, ND2, ND3, ND4 after the carrier wafer 200 is flipped, in accordance with the embodiment of the present invention. The carrier wafer 200 is flipped and the carrier wafer 200 becomes a handler wafer.

Figure 31:
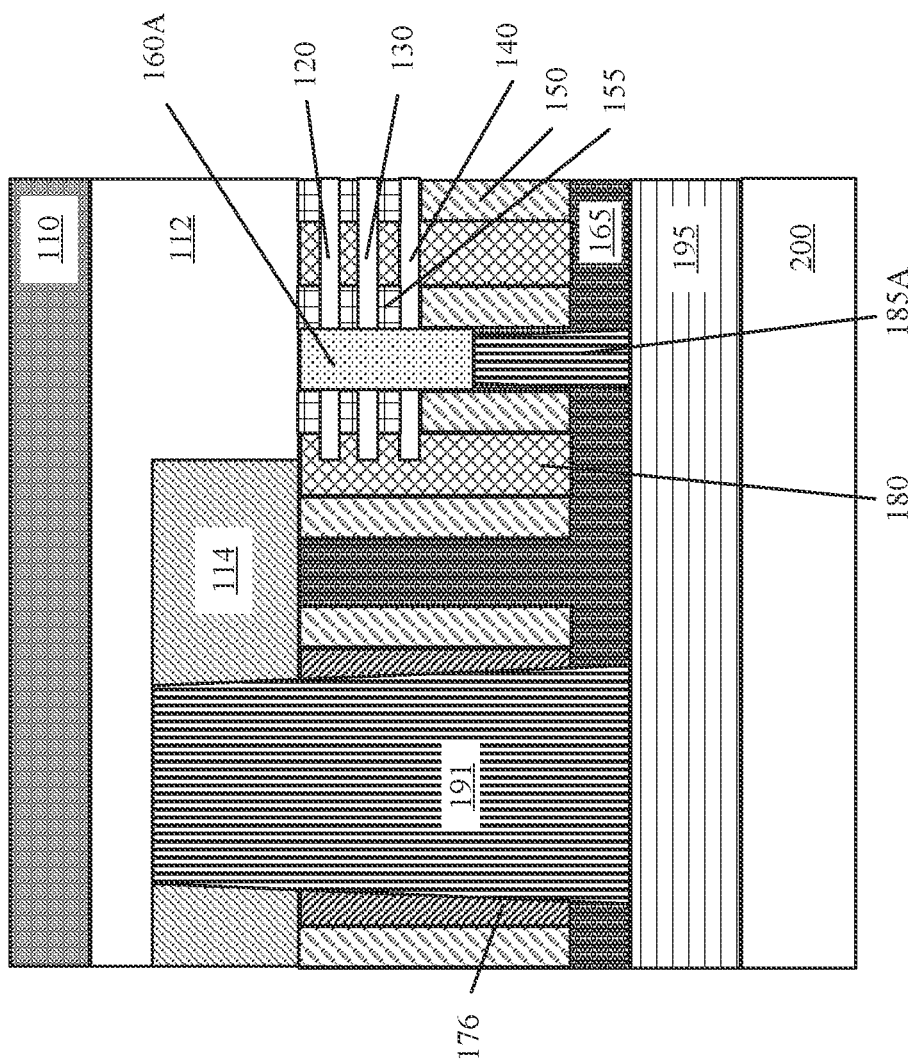

FIGS. 31-33 illustrate cross sections X, $Y_1$, and $Y_2$, respectively, of the plurality of nanodevices ND1, ND2, ND3, ND4 after the removal of the substrate 105, in accordance with the embodiment of the present invention. The substrate 105 is removed by, for example, a combination of processes such as wafer grinding, CMP, and/or selective dry/wet etch, stopping on the etch stop layer 110.

Figure 34:
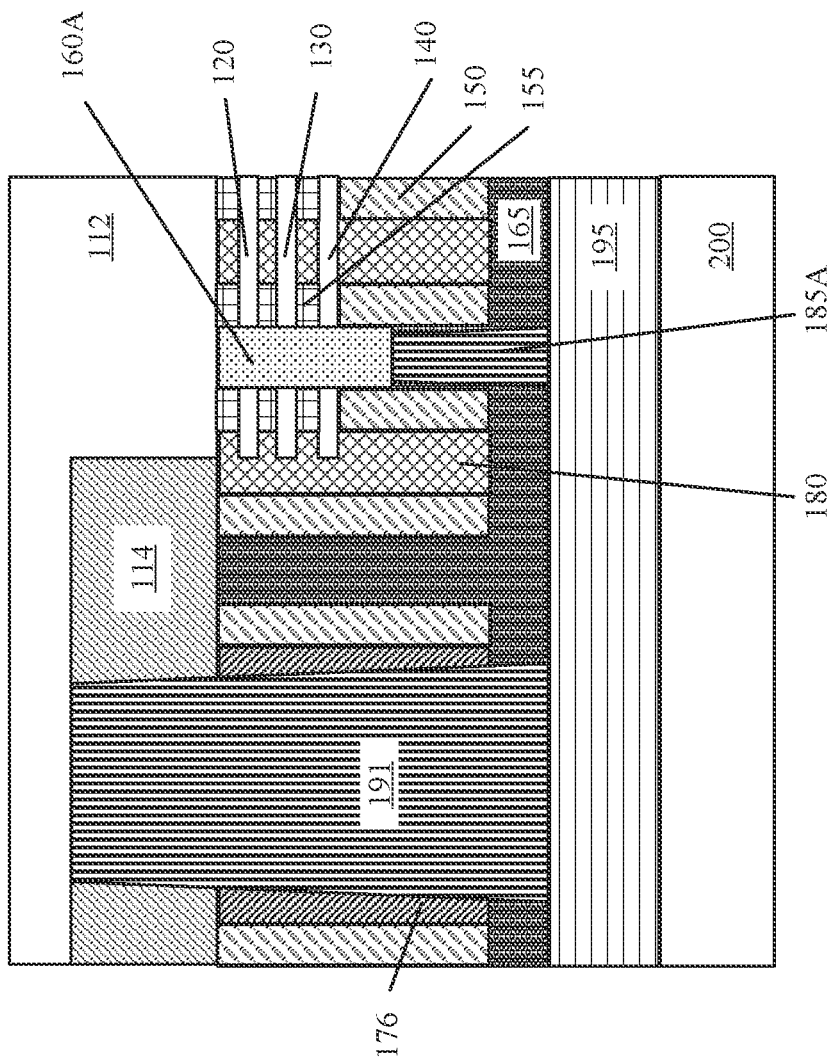

FIGS. 34-36 illustrate cross sections X, $Y_1$, and $Y_2$, respectively, of the plurality of nanodevices ND1, ND2, ND3, ND4 after the removal of the etch stop layer 110, in accordance with the embodiment of the present invention. The etch stop layer 110 is removed to expose the underlying substrate layer 112.

Figure 37:
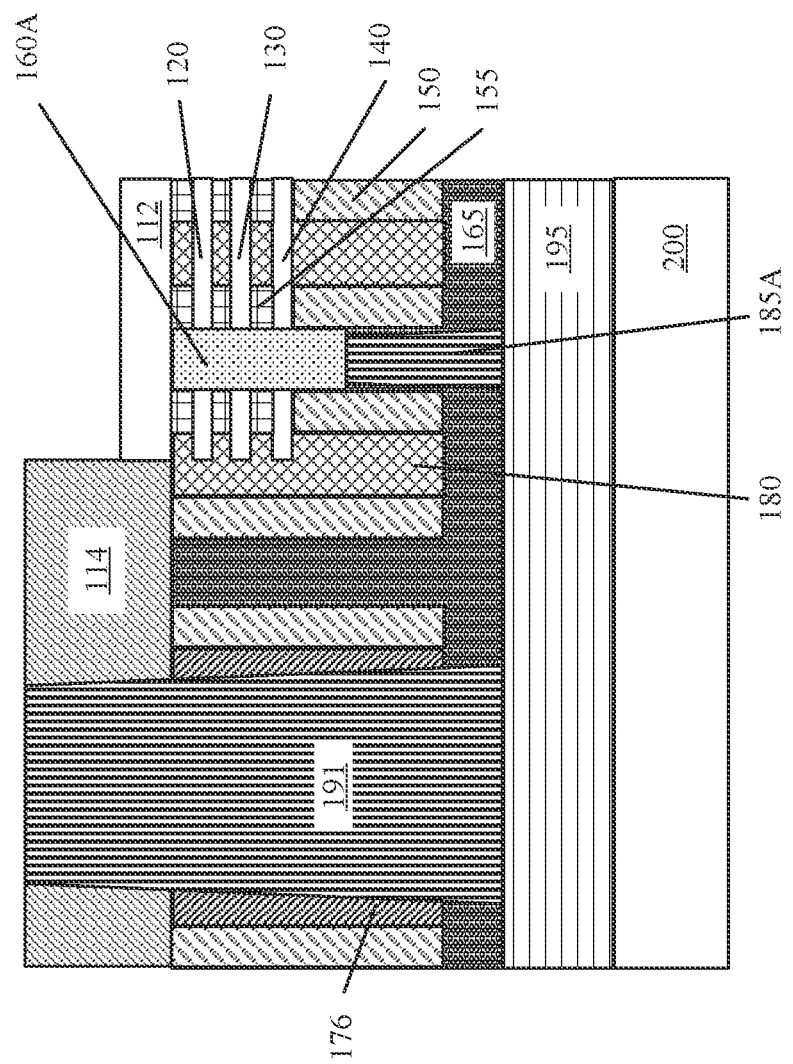
FIGS. 37-39 illustrate cross sections X, $Y_1$, and $Y_2$, respectively, of the plurality of nanodevices after the selective recessing of the underlying substrate layer, in accordance with the embodiment of the present invention.
Figures 38, 39:
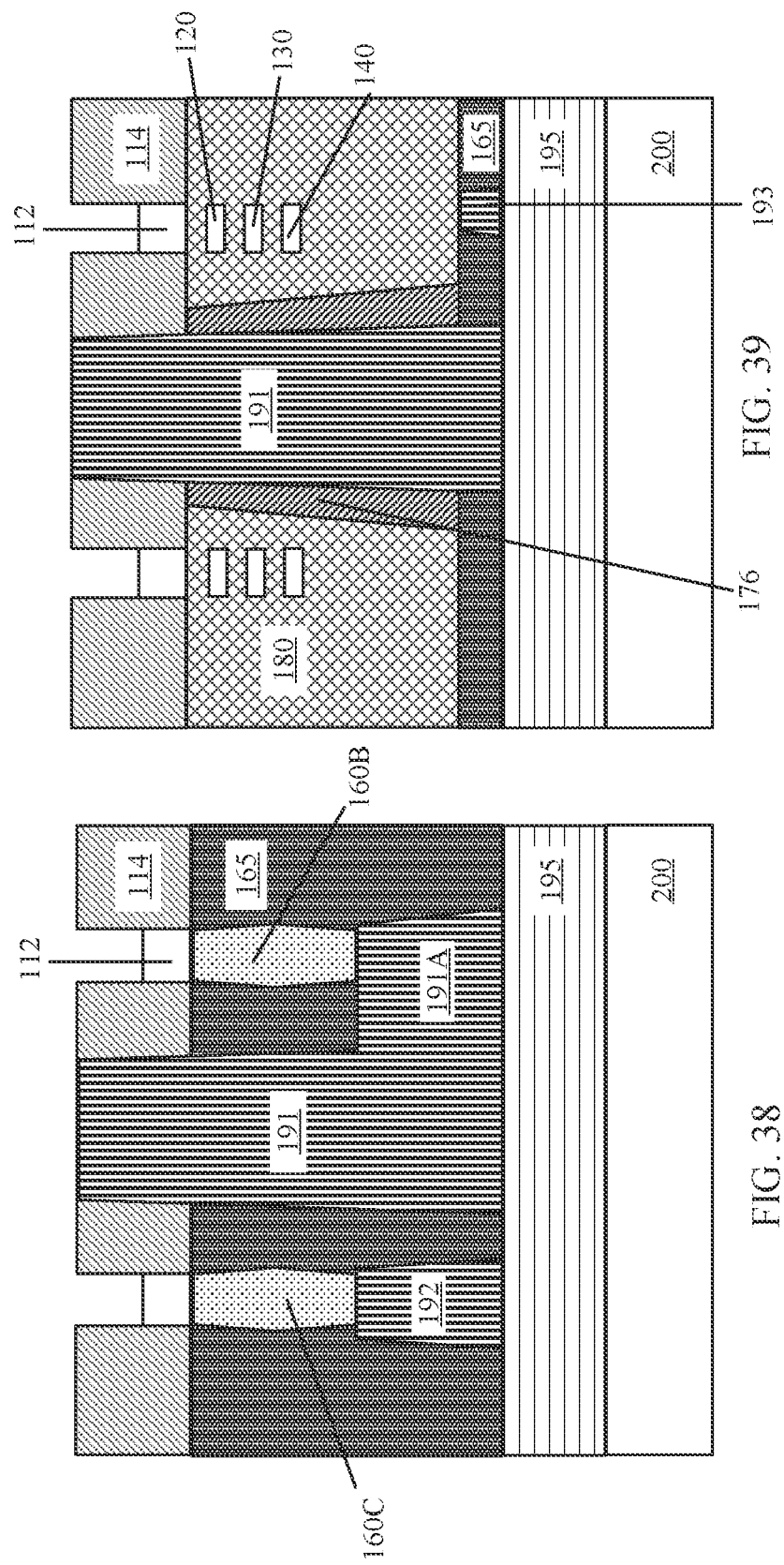

FIGS. 37-39 illustrate cross sections X, $Y_1$, and $Y_2$, respectively, of the plurality of nanodevices ND1, ND2, ND3, ND4 after the selective recessing of the underlying substrate layer 112, in accordance with the embodiment of the present invention. The underlying substrate layer 112 is removed by, for example, a selective wet or dry etch process. A top surface of the second VBPR 191 is no longer in contact with a bottom surface of the underlying substrate layer 112.

Figure 40:
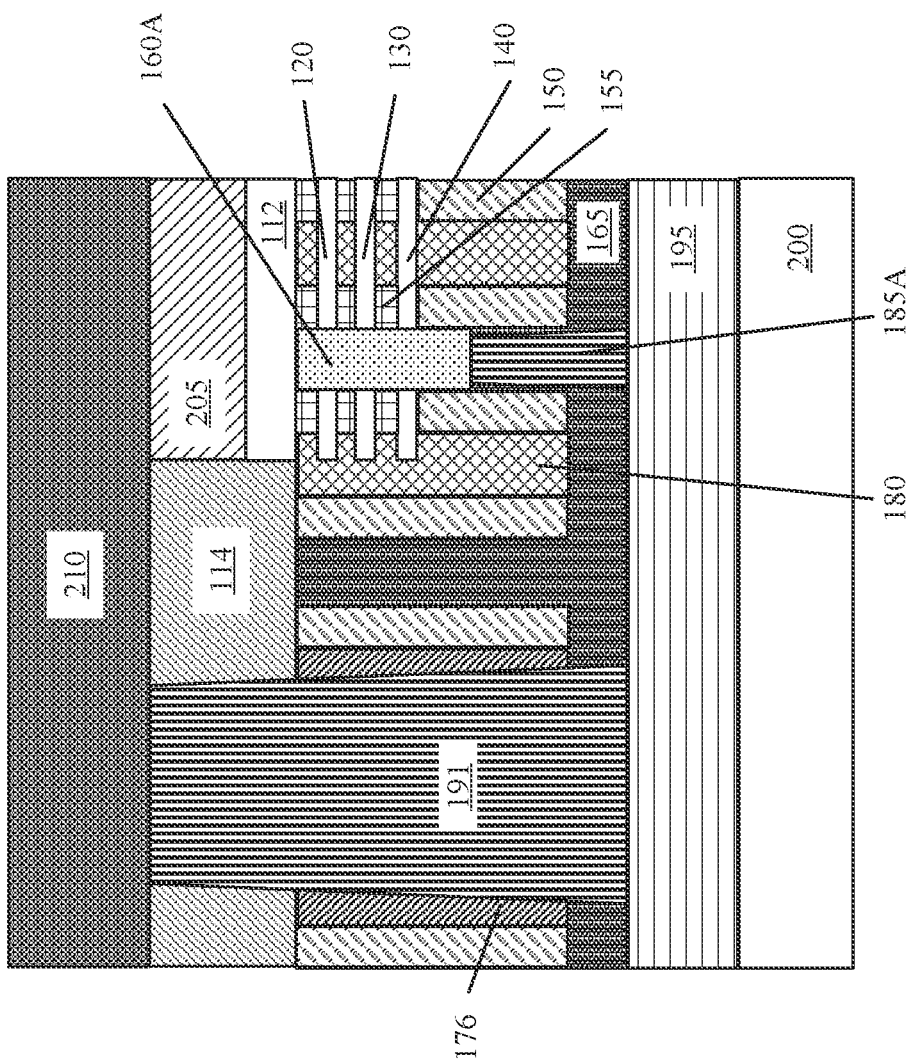

FIGS. 40-42 illustrate cross sections X, $Y_1$, and $Y_2$, respectively, of the plurality of nanodevices ND1, ND2, ND3, ND4 after the formation of a backside power rail (BPR) 210, in accordance with the embodiment of the present invention. In FIG. 40, a backside ILD (BILD) layer 205 is deposited directly atop the underlying substrate layer 112. Then, the BPR 210 is patterned using conventional lithography and etching processes, followed by metallization (e.g., Cu, Co or Ru fill with adhesion liner such as TiN). The BPR 210 is formed directly atop the STI region 114, the second VBPR 191, and the BILD layer 205. In FIGS. 41 and 42, the BILD layer 205 is deposited directly atop the underlying substrate layer 112 and the STI region 114. Then, the BPR 210 is patterned using conventional lithography and etching processes, followed by metallization (e.g., Cu, Co or Ru fill with adhesion liner such as TiN). The BPR 210 is formed directly atop the second VBPR 191. In FIGS. 40-42, a top surface of the second VBPR 191 is connected to the BPR 210. The bottom surface of the BPR 210 is larger than the top surface of the second VBPR 191.

Figure 43:
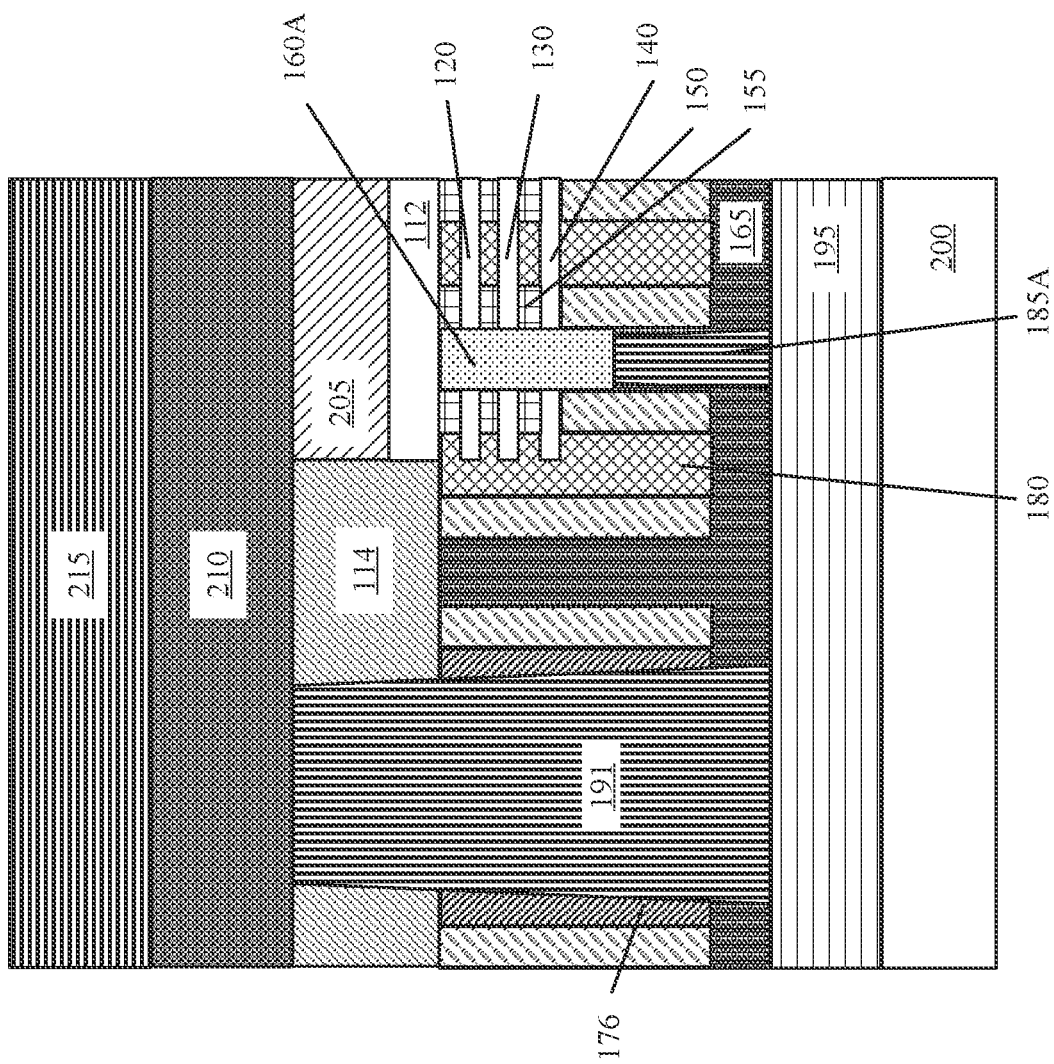
FIGS. 43-45 illustrate cross sections X, $Y_1$, and $Y_2$, respectively, of the plurality of nanodevices after the formation of a backside power distribution network (BSPDN), in accordance with the embodiment of the present invention.
Figure 45:
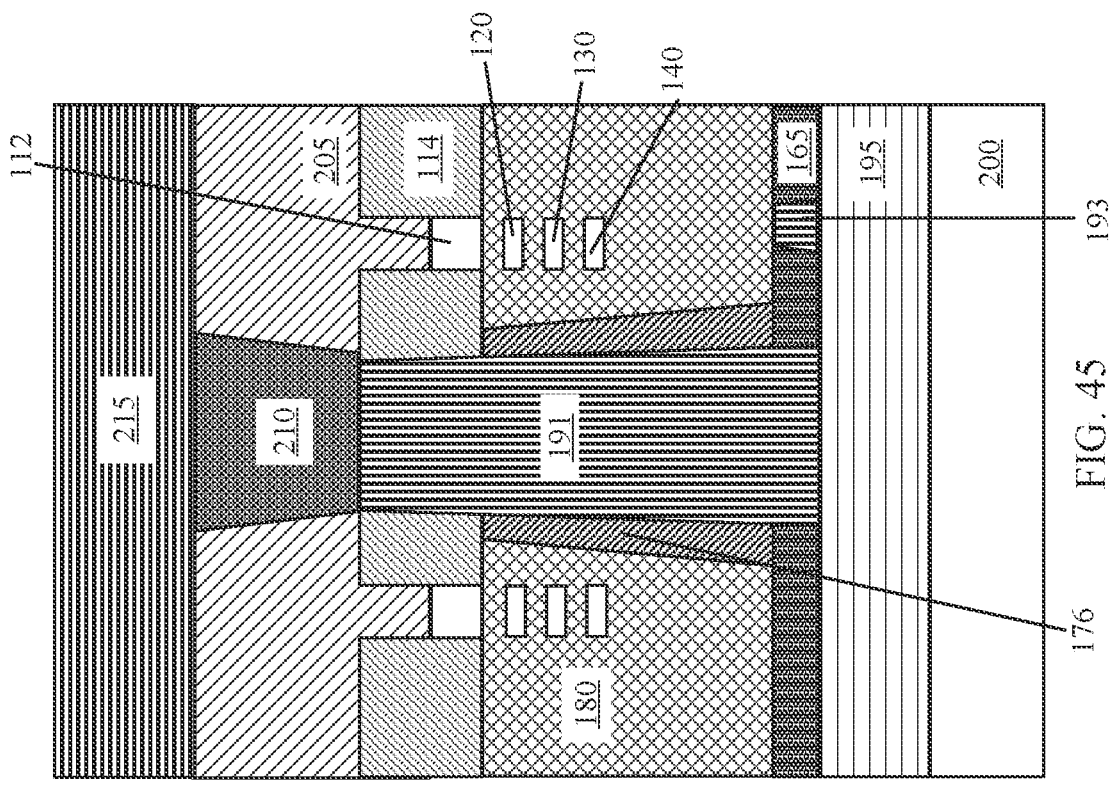
Figure 44:
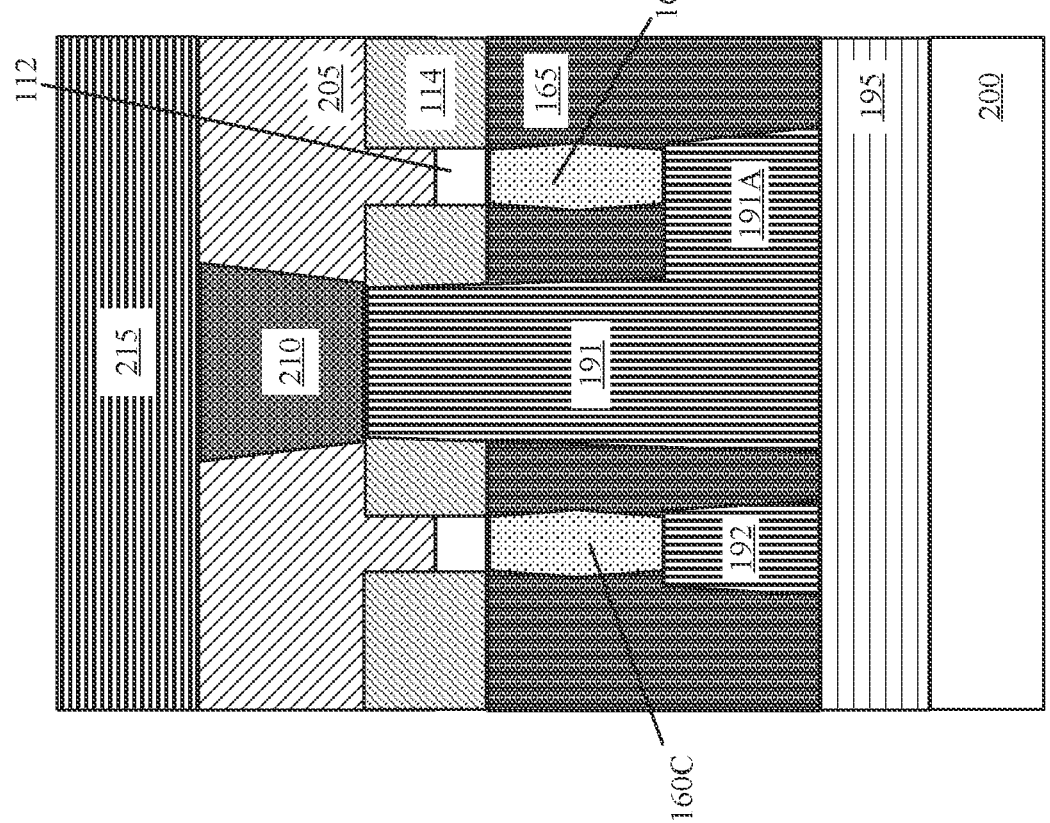

FIGS. 43-45 illustrate cross sections X, $Y_1$, and $Y_2$, respectively, of the plurality of nanodevices ND1, ND2, ND3, ND4 after the formation of a backside power distribution network (BSPDN) 215, in accordance with the embodiment of the present invention. In FIG. 43, the BSPDN 215 is formed directly atop the BPR 210. In FIGS. 44 and 45, the BSPDN 215 is formed directly atop the BPR 210 and the BILD layer 205.

The second nanodevice ND2 and the third nanodevice ND3 have varying widths along the first axis. By mirroring narrow sections of the second nanodevice ND2 and the third nanodevice ND3, a larger gap is created in the middle sections S2 of the second nanodevice ND2 and the third nanodevice ND3. The larger gap allows for the middle gate cut region having a larger dimension along the second axis than the first gate cut region and the third gate cut region.

The larger dimension of the middle gate cut region allows for a plurality of second gate cut dielectric pillars 176 in the middle gate cut region that have a length along the second axis greater than a length along the second axis of a plurality of first gate cut dielectric pillars 175 and the third gate cut dielectric pillars 177 in the first gate cut region and the third gate cut region, respectively. The larger dimension of the middle gate cut region also allows for the middle section contact 191 having the first protrusion 191A and the second protrusion 191B, where the width of the middle section contact 191 extends along the first axis across the plurality of second gate cut dielectric pillars 176. The width of the middle section contact 191 is greater than the width of the first VBPR 185B. The length of the middle section contact 191 is greater than the length of the first VBPR 185B.

It may be appreciated that FIGS. 1-45 provide only an illustration of one implementation and do not imply any limitations with regard to how different embodiments may be implemented. Many modifications to the depicted environments may be made based on design and implementation requirements.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor device comprising:
a first nanodevice comprised of a plurality of first transistors, and a second nanodevice comprised of a plurality of second transistors, wherein the second nanodevice is located adjacent to and parallel to the first nanodevice; and
the first nanodevice includes a first section, a second section, and a third section, wherein the second section of the first nanodevice is located between the first section and the third section of the first nanodevice, and wherein the second section of the first nanodevice defines a cut-out facing the second section of the second nanodevice;

the second nanodevice includes a first section, a second section, and a third section, wherein the second section of the second nanodevice is located between the first section and the third section of the second nanodevice, and wherein the second section of the second nanodevice defines a cut-out facing the second section of the first nanodevice;

wherein the first section of the first nanodevice and the first section of the second nanodevice are spaced apart from each other by a first distance, wherein the second section of the first nanodevice and the second section of the second nanodevice are spaced apart from each other by a second distance, wherein the third section of the first nanodevice and the third section of the second nanodevice are spaced apart from each other by a third distance, wherein the second distance is greater than the first distance, wherein the first distance is substantially equal to the third distance.

2. The semiconductor device of claim 1, wherein the first nanodevice has a first width in the first section, a second width in the second section, and a third width in the third section, wherein the first width and the third width are substantially equal, wherein the first width is larger than the second width.

3. The semiconductor device of claim 2, wherein the second nanodevice has a first width in the first section, a second width in the second section, and a third width in the third section, wherein the first width and the third width are substantially equal, wherein the first width is larger than the second width.

4. The semiconductor device of claim 3, wherein the second nanodevice has a mirrored orientation to the first nanodevice.

5. A semiconductor device comprising:
a first nanodevice comprised of a plurality of first transistors, and a second nanodevice comprised of a plurality of second transistors, wherein the second nanodevice is located adjacent to and parallel to the first nanodevice along a first axis;
the first nanodevice includes a first section, a second section, and a third section, wherein the second section of the first nanodevice is located between the first section and the third section of the first nanodevice, and wherein the second section of the first nanodevice defines a cut-out facing the second section of the second nanodevice;
the second nanodevice includes a first section, a second section, and a third section, wherein the second section of the second nanodevice is located between the first section and the third section of the second nanodevice, and wherein the second section of the second nanodevice defines a cut-out facing the second section of the first nanodevice;
a first gate cut region located between the first section of the first nanodevice and the first section of the second nanodevice;
a middle gate cut region located between the second section of the first nanodevice and the second section of the second nanodevice; and
a third gate cut region located between the third section of the first nanodevice and the third section of the second nanodevice;
wherein the middle gate cut region has different dimensions along a second axis than the first gate cut region;

wherein the middle gate cut region has different dimensions along the second axis than the third gate cut region.

6. The semiconductor device of claim 5, wherein the first gate cut region is comprised of:
a plurality of first gate cut dielectric pillars located between the first section of the first nanodevice and the first section of the second nanodevice,
wherein each of the plurality of first gate cut dielectric pillars extends a first length along the second axis.

7. The semiconductor device of claim 6, wherein the third gate cut region is comprised of:
a plurality of third gate cut dielectric pillars located between the third section of the first nanodevice and the third section of the second nanodevice,
wherein each of the plurality of third gate cut dielectric pillars extends a third length along the second axis, wherein the first length is substantially equal to the third length.

8. The semiconductor device of claim 7, wherein the middle gate cut region is comprised of:
a plurality of second gate cut dielectric pillars located between the second section of the first nanodevice and the second section of the second nanodevice, wherein each of the plurality of second gate cut dielectric pillars extends a second length along the second axis, wherein the second length is greater than the first length.

9. The semiconductor device of claim 8, wherein the first length is less than the first distance, wherein the second length is less than the second distance, wherein the third length is less than the third distance.

10. A semiconductor device comprising:
a first nanodevice comprised of a plurality of first transistors, and a second nanodevice comprised of a plurality of second transistors, wherein the second nanodevice is located adjacent to and parallel to the first nanodevice along a first axis;
the first nanodevice includes a first section, a second section, and a third section, wherein the second section of the first nanodevice is located between the first section and the third section of the first nanodevice, and wherein the second section of the first nanodevice defines a cut-out facing the second section of the second nanodevice;
the second nanodevice includes a first section, a second section, and a third section, wherein the second section of the second nanodevice is located between the first section and the third section of the second nanodevice, and wherein the second section of the second nanodevice defines a cut-out facing the second section of the first nanodevice;
a first gate cut region located between the first section of the first nanodevice and the first section of the second nanodevice;
a middle gate cut region located between the second section of the first nanodevice and the second section of the second nanodevice; and
a third gate cut region located between the third section of the first nanodevice and the third section of the second nanodevice, wherein the middle gate cut region has different dimensions along a second axis than the first gate cut region; wherein the middle gate cut region has different dimensions along the second axis than the third gate cut region; and
a middle section contact located in the middle gate cut region, wherein the middle section contact extends along the first axis.

11. The semiconductor device of claim 10, further comprising:
a plurality of first gate cut dielectric pillars located between the first section of the first nanodevice and the first section of the second nanodevice;
a plurality of second gate cut dielectric pillars located between the second section of the first nanodevice and the second section of the second nanodevice; and
a plurality of third gate cut dielectric pillars located between the third section of the first nanodevice and the third section of the second nanodevice.

12. The semiconductor device of claim 11, wherein the middle section contact is in contact with the plurality of second gate cut dielectric pillars.

13. The semiconductor device of claim 12, wherein the middle section contact has a first protrusion and a second protrusion, wherein the first protrusion is connected to a first source/drain of at least one transistor located in the second section of the first nanodevice.

14. The semiconductor device of claim 13, wherein the second protrusion is connected to a second source/drain of at least one transistor located in the second section of the second nanodevice.

15. The semiconductor device of claim 14, further comprising:
a first source/drain contact, wherein the first source/drain contact includes a first section and a first via (VBPR), wherein the first section of the first source/drain contact is connected to a third source/drain of at least one transistor located in the first section of the first nanodevice, wherein the first VBPR extends a first length along the second axis towards the first section of the second nanodevice.

16. The semiconductor device of claim 15, wherein the middle section contact extends a second length along the second axis from where the first protrusion is connected to the middle section contact to where the second protrusion extends off the middle section contact.

17. The semiconductor device of claim 16, wherein the second length of the middle section contact is greater than the first length of the first VBPR.

18. The semiconductor device of claim 17, wherein each of the plurality of first gate cut dielectric pillars extends a third length along the second axis, wherein each of the plurality of second gate cut dielectric pillars extends a fourth length along the second axis.

19. The semiconductor device of claim 18, wherein the second length of the middle section contact is greater than the third length of each of the plurality of first gate cut dielectric pillars, and wherein the second length of the middle section contact is less than the fourth length of each of the plurality of second gate cut dielectric pillars.

20. The semiconductor device of claim 15, wherein the first VBPR extends a first width along the first axis between two first gate cut dielectric pillars, wherein the first width does not overlap the first gate cut dielectric pillars, wherein a second width of the middle section contact extending along the first axis is greater than the first width of the first VBPR.

* * * * *